United States Patent
Im et al.

(10) Patent No.: US 9,978,661 B2
(45) Date of Patent: May 22, 2018

(54) PACKAGED SEMICONDUCTOR CHIPS HAVING HEAT DISSIPATION LAYERS AND GROUND CONTACTS THEREIN

(71) Applicants: Yunhyeok Im, Hwaseongi-si (KR); Oleg Feygenson, Hwaseongi-si (KR); Sang Il Kim, Seoul (KR); Youngbae Kim, Hwaseongi-si (KR); Jichul Kim, Yongin-si (KR); Seungkon Mok, Suwon-si (KR); Jungsu Ha, Osan-si (KR)

(72) Inventors: Yunhyeok Im, Hwaseongi-si (KR); Oleg Feygenson, Hwaseongi-si (KR); Sang Il Kim, Seoul (KR); Youngbae Kim, Hwaseongi-si (KR); Jichul Kim, Yongin-si (KR); Seungkon Mok, Suwon-si (KR); Jungsu Ha, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/235,958

(22) Filed: Aug. 12, 2016

(65) Prior Publication Data
US 2017/0047264 A1   Feb. 16, 2017

(30) Foreign Application Priority Data
Aug. 13, 2015 (KR) .......................... 10-2015-0114836

(51) Int. Cl.
*H01L 23/367* (2006.01)
*H01L 23/373* (2006.01)
(Continued)

(52) U.S. Cl.
CPC .......... *H01L 23/367* (2013.01); *H01L 21/563* (2013.01); *H01L 23/3736* (2013.01);
(Continued)

(58) Field of Classification Search
CPC . H01L 23/367; H01L 23/3736; H01L 21/563; H01L 23/552; H01L 21/562; H01L 25/105; H01L 29/0657
See application file for complete search history.

(56) References Cited

U.S. PATENT DOCUMENTS 6,821,819 B1   11/2004   Benavides et al.
8,336,202 B2   12/2012   Okamoto
(Continued)

FOREIGN PATENT DOCUMENTS

| JP | 2014-1439 | 1/2014 |
|---|---|---|
| KR | 1020130000681 | 1/2013 |
| KR | 10-2014-0088762 A | 7/2014 |
| KR | 1020140094081 A | 7/2014 |
| KR | 10-1537390 B1 | 7/2015 |

*Primary Examiner* — Walter H Swanson
(74) *Attorney, Agent, or Firm* — Myers Bigel, P.A.

(57) ABSTRACT

Semiconductor packages and methods of fabricating the same are disclosed. The semiconductor package may include a package substrate, a semiconductor chip, which is mounted on the package substrate to have a bottom surface facing the package substrate and a top surface opposite to the bottom surface, a mold layer provided on the package substrate to encapsulate the semiconductor chip, and a heat dissipation layer provided on the top surface of the semiconductor chip. The mold layer may have a top surface substantially coplanar with the top surface of the semiconductor chip, and the top surfaces of the semiconductor chip and the mold layer may have a difference in surface roughness from each other.

6 Claims, 38 Drawing Sheets

(51) Int. Cl.
*H01L 21/56* (2006.01)
*H01L 23/552* (2006.01)
*H01L 23/00* (2006.01)
*H01L 25/10* (2006.01)
*H01L 25/00* (2006.01)
*H01L 29/06* (2006.01)

(52) U.S. Cl.
CPC .......... *H01L 23/552* (2013.01); *H01L 23/562* (2013.01); *H01L 25/105* (2013.01); *H01L 25/50* (2013.01); *H01L 29/0657* (2013.01); H01L 24/13 (2013.01); H01L 24/16 (2013.01); H01L 24/32 (2013.01); H01L 24/48 (2013.01); H01L 24/73 (2013.01); H01L 24/92 (2013.01); H01L 2224/13025 (2013.01); H01L 2224/16225 (2013.01); H01L 2224/16227 (2013.01); H01L 2224/32225 (2013.01); H01L 2224/48091 (2013.01); H01L 2224/48227 (2013.01); H01L 2224/73204 (2013.01); H01L 2224/73253 (2013.01); H01L 2224/73265 (2013.01); H01L 2224/92125 (2013.01); H01L 2225/1023 (2013.01); H01L 2225/1058 (2013.01); H01L 2225/1094 (2013.01); H01L 2924/00014 (2013.01); H01L 2924/10158 (2013.01); H01L 2924/15311 (2013.01); H01L 2924/15331 (2013.01); H01L 2924/181 (2013.01); H01L 2924/18161 (2013.01); H01L 2924/3025 (2013.01); H01L 2924/3511 (2013.01)

(56) References Cited

U.S. PATENT DOCUMENTS

| | | | |
|---|---|---|---|
| 8,436,461 | B2 | 5/2013 | Ohno |
| 8,581,385 | B2 | 11/2013 | Lee |
| 8,758,849 | B2 | 6/2014 | Olzak |
| 8,884,421 | B2 | 11/2014 | Kang et al. |
| 8,921,879 | B2 | 12/2014 | Nam et al. |
| 9,013,031 | B2 | 4/2015 | Im et al. |
| 9,129,929 | B2 | 9/2015 | Lundberg |
| 9,163,899 | B2 | 10/2015 | Joh |
| 9,165,899 | B2 | 10/2015 | Joh |
| 9,230,876 | B2 | 1/2016 | Lee et al. |
| 2003/0025215 | A1* | 2/2003 | Lee ............... H01L 21/565 257/796 |
| 2011/0227209 | A1* | 9/2011 | Yoon ............ H01L 23/3128 257/686 |
| 2012/0032314 | A1* | 2/2012 | Chen ............. H01L 21/563 257/666 |
| 2013/0208426 | A1* | 8/2013 | Kim ............. H01L 25/0657 361/717 |
| 2014/0027796 | A1 | 1/2014 | Nam et al. |
| 2014/0239478 | A1* | 8/2014 | Hong ............ H01L 21/6836 257/698 |
| 2014/0339692 | A1* | 11/2014 | Kim .............. H01L 23/36 257/713 |
| 2015/0054148 | A1 | 2/2015 | Jang |
| 2015/0115443 | A1* | 4/2015 | Oh ............... H01L 23/3135 257/738 |

* cited by examiner (COMPARATIVE EXAMPLE)

(A)  (B)

PACKAGED SEMICONDUCTOR CHIPS HAVING HEAT DISSIPATION LAYERS AND GROUND CONTACTS THEREIN

CROSS-REFERENCE TO RELATED APPLICATIONS

This U.S. non-provisional patent application claims priority under 35 U.S.C. § 119 to Korean Patent Application No. 10-2015-0114836, filed on Aug. 13, 2015, in the Korean Intellectual Property Office, the entire contents of which are hereby incorporated by reference.

BACKGROUND OF THE INVENTION

Example embodiments of the inventive concept relate to semiconductor devices, and in particular, semiconductor packages and methods of fabricating the same.

Various materials with different thermal expansion coefficients are used for a semiconductor package, and such a difference in thermal expansion coefficients between the materials may lead to warpage of the semiconductor package. The warpage of the semiconductor package may cause failures in fabrication process and/or operation of a semiconductor product. In addition, electromagnetic interference (EMI) may occur in a semiconductor product, and this may lead to heating and malfunction issues of the semiconductor product. Accordingly, it may be advantageous to prevent, reduce and/or suppress deterioration in thermal and electric characteristics of a semiconductor package, under various environments.

SUMMARY

Example embodiments of the inventive concept provide semiconductor packages with improved thermal characteristics and methods of fabricating the same.

Other example embodiments of the inventive concept provide semiconductor packages with improved warpage characteristics and methods of fabricating the same.

Still other example embodiments of the inventive concept provide semiconductor packages with improved electric characteristics and methods of fabricating the same.

Even other example embodiments of the inventive concept provide semiconductor packages, which can be fabricated with high production yield, and methods of fabricating the same.

According to some aspects of the inventive concept, a semiconductor package may include a heat dissipation layer formed on a surface of a semiconductor chip by a cold spray process.

According to some aspects of the inventive concept, the heat dissipation layer may be formed to be in direct contact with the semiconductor chip, and this makes it possible to minimize the loss in heat transfer.

According to some aspects of the inventive concept, the heat dissipation layer may be configured in such a way that a compressive force thereof has strength capable of preventing a semiconductor package from suffering from a warpage issue.

According to some aspects of the inventive concept, a cold spray process may be performed in such a way that an EMI shielding layer is not formed in a gap between upper and lower packages constituting a PoP-type semiconductor package.

According to some aspects of the inventive concept, since the EMI shielding layer is not formed in the gap, it is possible to prevent the shielding layer from being in contact with connection terminals of the upper and lower packages and consequently to prevent a short circuit from occurring.

According to some aspects of the inventive concept, a cold spray process may be performed to form an interposer on a lower package of a PoP-type semiconductor package.

According to some aspects of the inventive concept, the interposer may be configured to provide an electric connection pathway between the upper and lower packages and to suppress technical issues associated with heat dissipation and warpage.

According to example embodiments of the inventive concept, a semiconductor package may include a semiconductor chip mounted on a package substrate, the semiconductor chip having a bottom surface facing the package substrate and a top surface opposite to the bottom surface, a mold layer provided on the package substrate to encapsulate the semiconductor chip, and a heat dissipation layer provided on the top surface of the semiconductor chip. The mold layer may have a top surface substantially coplanar with the top surface of the semiconductor chip, and the top surfaces of the semiconductor chip and the mold layer may have a difference in surface roughness from each other.

In some embodiments, the surface roughness of the top surface of the semiconductor chip may be smaller than that of the top surface of the mold layer.

In some embodiments, the heat dissipation layer may be in direct contact with the top surface of the semiconductor chip.

In some embodiments, the heat dissipation layer may extend from the top surface of the semiconductor chip toward the top surface of the mold layer and may be in direct contact with the top surface of the mold layer.

In some embodiments, the heat dissipation layer may include a bottom surface facing the top surface of the semiconductor chip and a top surface opposite to the bottom surface thereof, and the top surface of the heat dissipation layer may be uneven.

In some embodiments, the heat dissipation layer may include a first metal layer adjacent to the top surface of the semiconductor chip, and a second metal layer provided on the first metal layer. The second metal layer may contain a second metal whose thermal conductivity is higher than that of the first metal layer, and the first metal layer may contain a first metal suppressing the second metal from being diffused into the semiconductor chip.

In some embodiments, the first metal may contain aluminum (Al) and the second metal may contain copper (Cu).

In some embodiments, an interface between the first metal layer and the second metal layer may be uneven.

In some embodiments, the package substrate may include a ground pad provided on an edge region of a top surface of the package substrate, and the heat dissipation layer may include a ground contact which is provided to pass through the mold layer and is electrically connected to the ground pad.

In some embodiments, the package substrate may include a ground pad provided on an edge region of a top surface of the package substrate, and the heat dissipation layer may include a ground contact which is extended toward the edge region of the top surface of the package substrate and is coupled to the ground pad.

In some embodiments, the package substrate may include a ground pad provided on a side surface of an edge region of the package substrate, and the heat dissipation layer may include a ground contact which is provided to cover the side surface of the edge region of the package substrate and is coupled to the ground pad.

According to example embodiments of the inventive concept, a semiconductor package may include a package substrate including top and bottom surface facing each other, a semiconductor chip mounted on the top surface of the package substrate, the semiconductor chip including a bottom surface facing the top surface of the package substrate and a top surface opposite to the bottom surface thereof, a mold layer lying on the top surface of the package substrate to enclose the semiconductor chip and having a top surface coplanar with the top surface of the semiconductor chip, and a heat dissipation layer provided on the semiconductor chip and the mold layer. The heat dissipation layer may be in direct contact with the top surface of the semiconductor chip and the top surface of the mold layer, and the top surface of the semiconductor chip may have surface roughness smaller than that of the top surface of the mold layer.

In some embodiments, the heat dissipation layer may include a bottom surface, which is in direct contact with the top surface of the semiconductor chip and the top surface of the mold layer, and a top surface, which is opposite to the bottom surface thereof, and the top surface of the heat dissipation layer may be uneven.

In some embodiments, the heat dissipation layer may be provided to have a uniform thickness on the top surface of the package substrate.

In some embodiments, the heat dissipation layer may be provided to have a non-uniform thickness on the top surface of the package substrate.

In some embodiments, the heat dissipation layer may be provided to completely cover the top surfaces of the semiconductor chip and the mold layer.

In some embodiments, the heat dissipation layer may be provided to cover a portion of the top surface of the semiconductor chip and a portion of the top surface of the mold layer.

According to example embodiments of the inventive concept, a semiconductor package may include a package substrate including top and bottom surface facing each other, a semiconductor chip mounted on the top surface of the package substrate, the semiconductor chip including a bottom surface facing the top surface of the package substrate and a top surface opposite to the bottom surface thereof, a mold layer lying on the top surface of the package substrate to enclose the semiconductor chip and having a top surface coplanar with the top surface of the semiconductor chip, and a heat dissipation layer covering the semiconductor chip and the mold layer. The heat dissipation layer may contact the semiconductor chip at a first interface therebetween. The heat dissipation layer may contact the mold layer at a second interface therebetween. The first and second interfaces may be uneven.

In some embodiments, the first interface may have a first surface roughness, and the second interface may have a second surface roughness greater than the first surface roughness.

In some embodiments, the heat dissipation layer may have a top surface opposite to the first interface, and the top surface of the heat dissipation layer may be uneven or even.

According to other example embodiments of the inventive concept, a method of fabricating a semiconductor package may include providing a package substrate, on which a semiconductor chip having top and bottom surfaces facing each other is mounted and on which a mold layer is provided to encapsulate the semiconductor chip and expose the top surface of the semiconductor chip, and providing metal powder on the package substrate to form a heat dissipation layer covering the semiconductor chip and the mold layer. The mold layer may be formed to have a top surface coplanar with the top surface of the semiconductor chip, and the top surface of the semiconductor chip may have a surface roughness different from that of the top surface of the mold layer.

In some embodiments, the package substrate may have a first temperature. The forming of the heat dissipation layer may include providing the metal powder on the package substrate. The metal powder may have a second temperature higher than the first temperature.

In some embodiments, the forming of the heat dissipation layer may include forming a metal layer, in which the metal powder at the second temperature is contained, and cooling the metal layer from the second temperature to a third temperature lower than the second temperature. The metal layer may have a compressive force produced by the cooling of the metal layer from the second temperature to the third temperature.

In some embodiments, the providing of the package substrate may include providing the package substrate having a curved profile at the first temperature, and the forming of the heat dissipation layer may be performed in such a way that the compressive force of the metal layer is applied to the package substrate with the curved profile to allow the package substrate to be flattened.

In some embodiments, the forming of the heat dissipation layer may include forming a metal layer having a uniform thickness on the top surface of the semiconductor chip and the top surface of the mold layer.

In some embodiments, the forming of the heat dissipation layer may include forming a metal layer having a non-uniform thickness on the top surface of the semiconductor chip and the top surface of the mold layer.

In some embodiments, the forming of the heat dissipation layer may include providing the metal powder containing at least one metal on the package substrate to form a metal layer with a single layered structure.

In some embodiments, the forming of the heat dissipation layer may include providing a first metal powder containing a first metal on the package substrate to form a first metal layer, and providing a second metal powder containing a second metal on the first heat dissipation layer to form a second metal layer stacked on the first metal layer. The second metal may have thermal conductivity higher than the first metal.

In some embodiments, the forming of the second metal layer may include forming an uneven interface between the first metal layer and the second metal layer.

In some embodiments, the forming of the heat dissipation layer may be performed to allow the semiconductor chip and the mold layer to have uneven top surfaces. The uneven top surface of the semiconductor chip may have first surface roughness, and the uneven top surface of the mold layer may have second surface roughness higher than the first surface roughness.

In some embodiments, the heat dissipation layer may have a bottom surface adjacent to the top surface of the semiconductor chip and a top surface opposite to the bottom surface thereof. The forming of the heat dissipation layer may be performed to allow the top surface of the heat dissipation layer to have an uneven surface of a third surface roughness, and the third surface roughness may be substantially equal to or different from one of the first and second surface roughnesses.

In some embodiments, the forming of the heat dissipation layer may further include grinding the top surface of the heat dissipation layer to allow the heat dissipation layer to have an even top surface.

According to other example embodiments of the inventive concept, a method of fabricating a semiconductor package may include providing a package substrate, on which a semiconductor chip with top and bottom surfaces facing each other is mounted, and on which a mold layer encapsulating the semiconductor chip and having a top surface coplanar with the top surface of the semiconductor chip is provided, and providing metal powder on the package substrate to form a heat dissipation layer covering the top surface of the semiconductor chip and the top surface of the mold layer. The heat dissipation layer may include a bottom surface adjacent to the top surfaces of the semiconductor chip and the mold layer and a top surface opposite to the bottom surface thereof. The bottom surface of the heat dissipation layer may be in contact with the top surface of the semiconductor chip to define a first interface, and the bottom surface of the heat dissipation layer may be in contact with the top surface of the mold layer to define a second interface, whose surface roughness is greater than that of the first interface.

In some embodiments, the providing of the package substrate may include providing the package substrate having a curved profile at a first temperature, and the forming of the heat dissipation layer may include providing the metal powder on the package substrate with the curved profile to form a metal layer having a second temperature higher than the first temperature on the top surface of the semiconductor chip and the top surface of the mold layer.

In some embodiments, the forming of the heat dissipation layer may include cooling the metal layer from the second temperature to a temperature lower than the second temperature, the metal layer may have a compressive force produced by the cooling of the metal layer, and the compressive force of the metal layer may be used to flatten the package substrate with the curved profile.

In some embodiments, the forming of the heat dissipation layer may include forming a metal layer having a substantially uniform or varying thickness, throughout the package substrate with the curved profile.

In some embodiments, the package substrate may be provided to include a ground pad, and the forming of the heat dissipation layer may further include forming a ground contact coupled to the ground pad.

According to other example embodiments of the inventive concept, a method of fabricating a semiconductor package may include providing a base with a curved profile at low temperature, the base including a package substrate, a semiconductor chip mounted on the package substrate, and a mold layer encapsulating the semiconductor chip, and providing metal powder of high temperature on the base with the curved profile to form a metal layer covering the base. The metal layer may have a compressive force, which is produced when the metal layer is cooled from the high temperature, and which is exerted to the base to allow the base with the curved profile to be flattened.

In some embodiments, the metal layer may be formed to have a single- or multi-layered structure and to be in direct contact with the semiconductor chip.

In some embodiments, each of the semiconductor chip and the mold layer may have a surface in direct contact with the metal layer, and the surface of the semiconductor chip may have a surface roughness smaller than that of the surface of the mold layer.

Some embodiments of the present inventive concept are directed to a semiconductor package that includes a package substrate comprising top and bottom surface facing each other, a semiconductor chip mounted on the top surface of the package substrate, the semiconductor chip comprising a bottom surface facing the top surface of the package substrate and a top surface that is opposite the bottom surface thereof, a mold layer lying on the top surface of the package substrate to enclose the semiconductor chip and covering a top surface of the semiconductor chip and a heat dissipation layer provided on the semiconductor chip and the mold layer. In some embodiments, the heat dissipation layer is in direct contact with the top surface of the top surface of the mold layer and spaced apart from the top surface of the semiconductor chip.

In some embodiments, the heat dissipation layer includes a bottom surface that is in direct contact with the top surface of the mold layer and that is spaced apart from the top surface of the semiconductor chip and a top surface that is opposite the bottom surface thereof. Some embodiments provide that the top surface of the heat dissipation layer is uneven.

Some embodiments provide that the heat dissipation layer has a uniform thickness on the top surface of the package substrate. In some embodiments, the heat dissipation layer has a non-uniform thickness on the top surface of the package substrate.

Some embodiments provide that the heat dissipation layer includes a first metal layer adjacent the top surface of the mold layer and a second metal layer provided on the first metal layer. In some embodiments, the second metal layer contains a second metal whose thermal conductivity is higher than a thermal conductivity of the first metal layer. Some embodiments provide that the first metal contains aluminum (Al) and the second metal contains copper (Cu).

In some embodiments, an interface between the first metal layer and the second metal layer is uneven.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
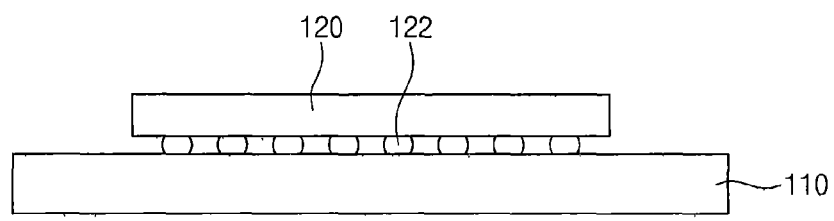
FIGS. 1A through 1D are sectional views illustrating a method of fabricating a semiconductor package according to some example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1D are sectional views illustrating methods of fabricating a semiconductor package according to some example embodiments of the inventive concept. FIG. 1E is an enlarged sectional view illustrating a portion of FIG. 1D. FIGS. 1F through 1H are sectional views illustrating modified examples of FIG. 1E. FIG. 2 is a sectional view illustrating a semiconductor package according to a comparative example.

Figure 2:
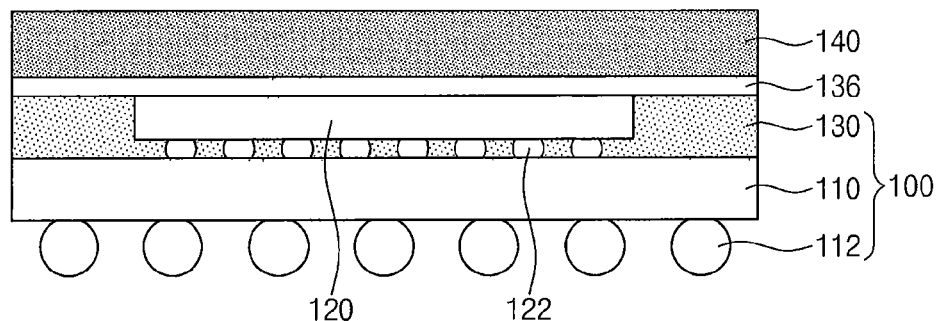
FIG. 2 is a sectional view illustrating a semiconductor package according to a comparative example.

Referring to FIG. 1A, a semiconductor chip 120 may be mounted on a top surface of a package substrate 110. The package substrate 110 may include, for example, a printed circuit board (PCB). The semiconductor chip 120 may be provided in the form of a memory chip, a logic chip, or a combination thereof. Inner terminals 122 (e.g., one or more solder balls) may be provided between the semiconductor chip 120 and the package substrate 110 to electrically connect the semiconductor chip 120 to the package substrate 110.

Figure 1B:
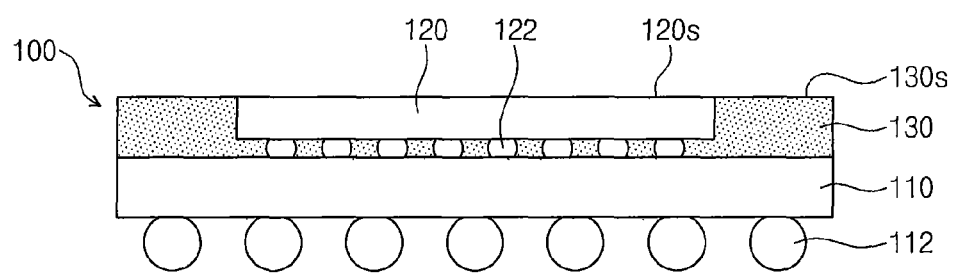

Referring to FIG. 1B, a mold layer 130 may be formed on the package substrate 110 to cover at least a portion of the semiconductor chip 120. The mold layer 130 may be formed to expose a top surface 120s of the semiconductor chip 120. A top surface 130s of the mold layer 130 may be coplanar with the top surface 120s of the semiconductor chip 120. As an example, the semiconductor chip 120 may be bonded on the package substrate 110 in a flip-chip bonding manner. As an example, the top surface 120s may serve as an inactive surface of the semiconductor chip 120. As another example, the top surface 120s may serve as an active surface of the semiconductor chip 120. Outer terminals 112 (e.g., one or more solder balls) may be attached to a bottom surface of the package substrate 110. Hereinafter, for convenience, a term 'base 100' will be used to refer to a structure including the package substrate 110, the semiconductor chip 120 mounted on the package substrate 110, and the mold layer 130 covering the package substrate 110.

Figure 1C:
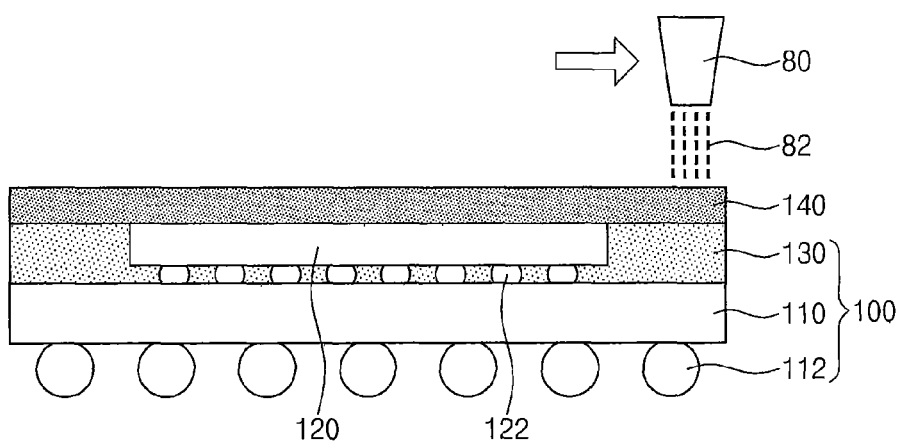

Referring to FIG. 1C, a heat dissipation layer 140 may be formed on the base 100. The heat dissipation layer 140 may be formed by spraying metal powder at a high speed (e.g., the speed of sound or higher) using a high-pressure gas (for example, by a cold spray process capable of depositing a metal layer at a deposition rate higher than that of a sputtering process). As an example, the heat dissipation layer 140 may be formed by providing a mixture 82 of metal powder and gas onto the base 100 through a spray nozzle 80. In some embodiments, there is no particular limitation on the material for the metal powder, and nitrogen, helium, and/or the air may be used as the gas for forming the heat dissipation layer 140.

During the formation of the heat dissipation layer 140, the spray nozzle 80 may be moved relative to the base 100. For example, the spray nozzle 80 may be moved along a direction parallel to a top surface of the base 100 at least one time to supply the mixture 82 on the base 100.

Figure 1D:
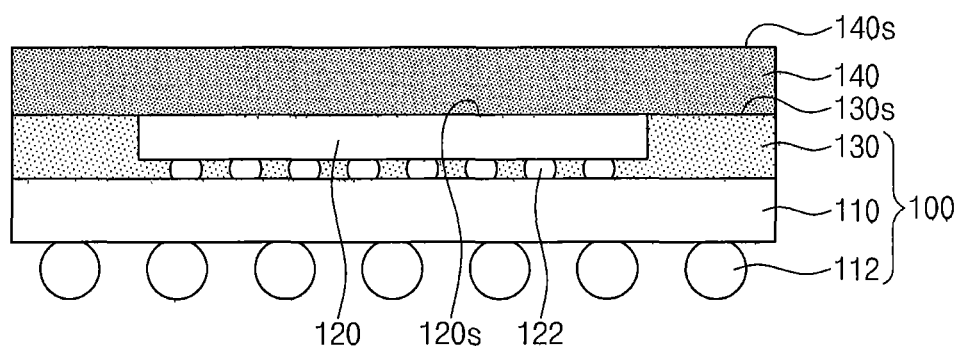
Figure 1E:
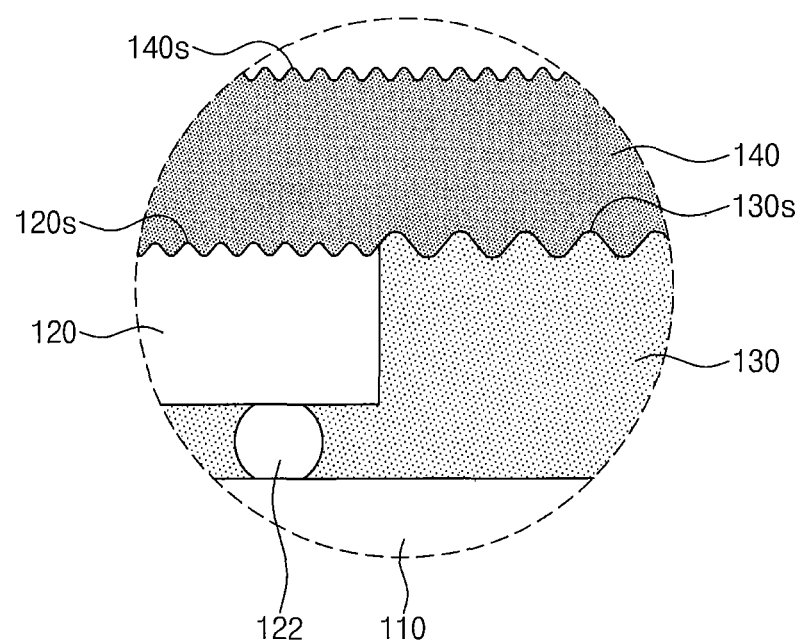
FIG. 1E is an enlarged sectional view illustrating a portion of FIG. 1D.
Figure 1F:
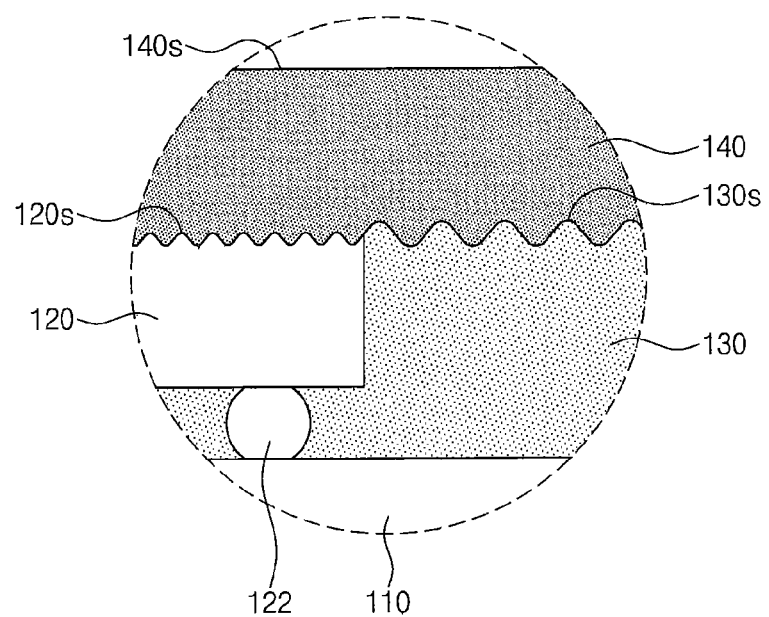
FIGS. 1F through 1H are sectional views illustrating modified examples of FIG. 1E.
Figure 1G:
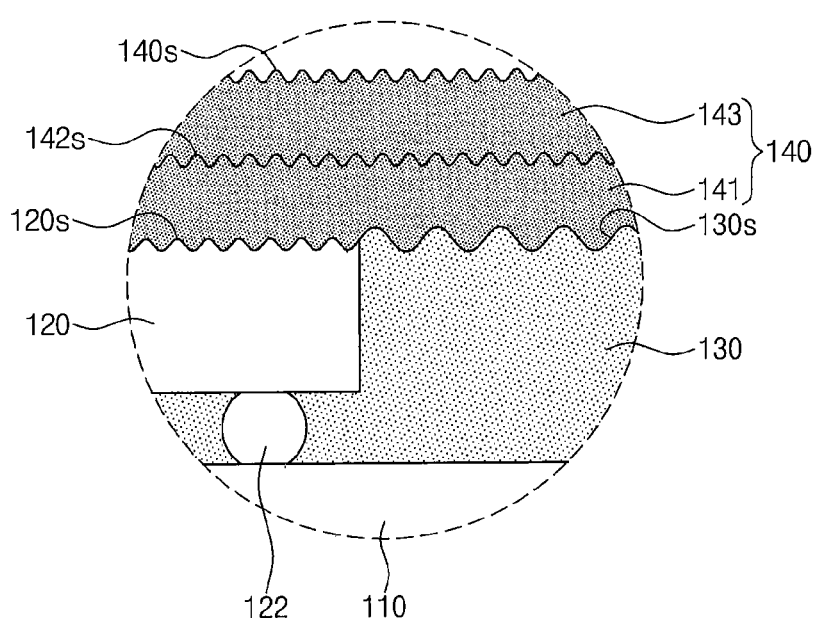
Figure 1H:
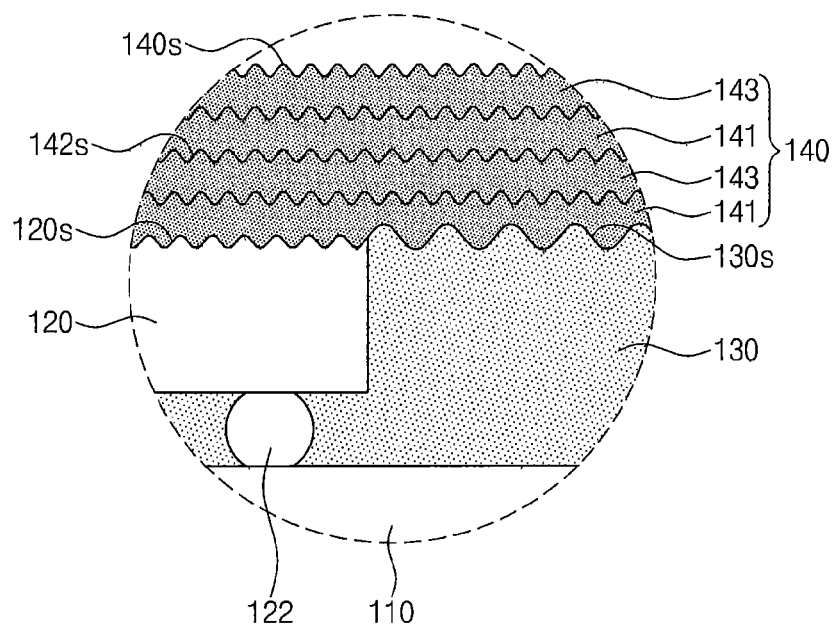

Referring to FIG. 1D, as a result of the above process, a semiconductor package 11 may be fabricated to include the base 100, in which the package substrate 110 and the semiconductor chip 120 mounted thereon are provided, and the heat dissipation layer 140, which is formed on the base 100. In some embodiments, the heat dissipation layer 140 may be in direct contact with the base 100. For example, the heat dissipation layer 140 may be in direct contact with the top surface 120s of the semiconductor chip 120 and the top surface 130s of the mold layer 130. Since the heat dissipation layer 140 is in direct contact with the semiconductor chip 120, it is possible to reduce thermal resistance and thermal loss in a heat flow from the semiconductor chip 120 to the heat dissipation layer 140.

Unlike the embodiment described herein, as shown in FIG. 2, a semiconductor package up may be fabricated to further include a heat transfer layer 136 (e.g., of a thermal interface material (TIM)) provided between the base 100 and the heat dissipation layer 140. In general, the heat transfer layer 136 may include a polymer material provided with fillers (e.g., metal particles). In the case of the semiconductor package up of FIG. 2 (i.e., including the heat transfer layer 136 provided between the semiconductor chip 120 and the heat dissipation layer 140), it is difficult to reduce thermal resistance in heat flow from the semiconductor chip 120 to the heat dissipation layer 140, compared with the semiconductor package 11 of FIG. 1D including the semiconductor chip 120 and the heat dissipation layer 140 in direct contact with each other. In other words, the direct contact between the semiconductor chip 120 and the heat dissipation layer 140 may allow the semiconductor package 11 to have good heat dissipation characteristics.

Referring to FIG. 1E, the heat dissipation layer 140 may be formed as a result of deformation (e.g., plastic deformation) and bonding (e.g., covalent bond) between metal particles and the base 100, which may result from a high-speed collision of metal particles (e.g., with a size or diameter of several to several hundred micrometers). Accordingly, a surface of the heat dissipation layer 140 and/or an interface between the heat dissipation layer 140 and the base 100 may not be flat.

For example, the top surface 120s of the semiconductor chip 120 in direct contact with the heat dissipation layer 140 may be an uneven surface with a first surface roughness. The top surface 130s of the mold layer 130 in direct contact with the heat dissipation layer 140 may be an uneven surface with a second surface roughness. The semiconductor chip 120 may be mainly formed of silicon and the mold layer 130 may be formed of an epoxy resin, and in this case, the first surface roughness may be smaller than the second surface roughness.

A top surface 140s of the heat dissipation layer 140 may be an uneven surface with a third surface roughness. The third surface roughness may be substantially equal or similar to one of the first and second surface roughnesses. In some embodiments, the third surface roughness may be different from each of the first and second surface roughnesses. In certain embodiments, as shown in FIG. 1F, the top surface 140s of the heat dissipation layer 140 may be an even surface. For example, after the formation of the heat dissipation layer 140, an additional process (e.g., a polishing process) may be performed on the heat dissipation layer 140 to allow the top surface 140s of the heat dissipation layer 140 to have a flat profile.

The heat dissipation layer 140 may be a single layer, as shown in FIG. 1E. As an example, the heat dissipation layer 140 may be a single layer containing copper (Cu). As another example, the heat dissipation layer 140 may be a single layer containing at least one of metals (e.g., copper (Cu), aluminum (Al), nickel (Ni), titanium (Ti), tungsten (W), tantalum (Ta), zinc (Zn), chromium (Cr), cobalt (Co), or alloys thereof).

The heat dissipation layer 140 may be a double layer including a first heat dissipation layer 141 and a second heat dissipation layer 143, as shown in FIG. 1G. The first heat dissipation layer 141 may contain a metallic material, allowing the first heat dissipation layer 141 to have an adhesive strength higher than that of the second heat dissipation layer 143, and the second heat dissipation layer 143 may contain a metallic material, allowing the second heat dissipation layer 143 to have thermal conductivity higher than that of the first heat dissipation layer 141. For example, the first heat dissipation layer 141 may be formed of or include aluminum (Al), and the second heat dissipation layer 143 may be formed of or include copper (Cu). Since aluminum (Al) prevents copper (Cu) from being diffused, the first heat dissipation layer 141 may be used as a diffusion barrier for preventing copper (Cu) from being diffused into the semiconductor chip 120.

The first heat dissipation layer 141 may be provided on the top surface 120s of the semiconductor chip 120 and the top surface 130s of the mold layer 130, and the second heat dissipation layer 143 may be provided on the first heat dissipation layer 141. At least one of the first and second heat dissipation layers 141 and 143 may be a single layer containing one of metallic elements or alloys thereof. An interface 142s between the first and second heat dissipation layers 141 and 143 may have an uneven profile. In some embodiments, the first and second heat dissipation layers 141 and 143 may be provided in such a way that thicknesses thereof are the same as, or similar to, or different from each other.

The heat dissipation layer 140 may be provided to have a multi-layered structure, in which the first and second heat dissipation layers 141 and 143 are alternatingly stacked one on another, as shown in FIG. 1H. The first heat dissipation layer 141 may contain aluminum (Al) or alloys thereof, and the second heat dissipation layer 143 may contain copper (Cu) or alloys thereof. The interfaces 142s between the first and second heat dissipation layers 141 and 143 may have an uneven profile. The first heat dissipation layer 141 may be used as the lowermost layer of the heat dissipation layer 140, and the second heat dissipation layer 143 may be used as the uppermost layer of the heat dissipation layer 140.

As another example, the first and second heat dissipation layers 141 and 143 may contain metallic elements that are different from each other. For example, in the heat dissipation layer 140, the first heat dissipation layer 141 at the lowermost level may contain aluminum (Al) or alloys thereof, the second heat dissipation layer 143 at the uppermost level may contain copper (Cu) or alloys thereof, and each of the first and second heat dissipation layers 141 and 143 at intermediate levels may contain one of metallic elements, other than aluminum and copper, or alloys thereof.

The afore-described features associated with the heat dissipation layer 140, previously described with reference to FIGS. 1E through 1H, may be applied for all of other embodiments of the inventive concept in the same or similar manner.

As shown in FIG. 1C, the spray nozzle 80 may be configured to allow the mixture 82 containing the metal powder to collide with the base 100 at a high speed. For example, the mixture 82 may have a temperature higher than a room temperature (e.g., about 25° C.) and lower than a melting point of the metal power. As a result of such a collision, the heat dissipation layer 140 composed of solid metal particles may be formed, as shown in FIG. 1D. Thereafter, when the heat dissipation layer 140 is cooled down, the heat dissipation layer 140 may be shrunken. The shrinkage of the heat dissipation layer 140 may be used to improve a warpage property of the semiconductor package 11, as will be described with reference to FIGS. 3A and 3B.

The cold spray process is not limited to the afore-described method, in which metal powder is used to form a metal layer, and it may be performed to form a nonmetal layer from polymer powder or powder of mixed materials. For example, the mold layer 130 may also be formed using such a cold spray process.

Figure 3A:
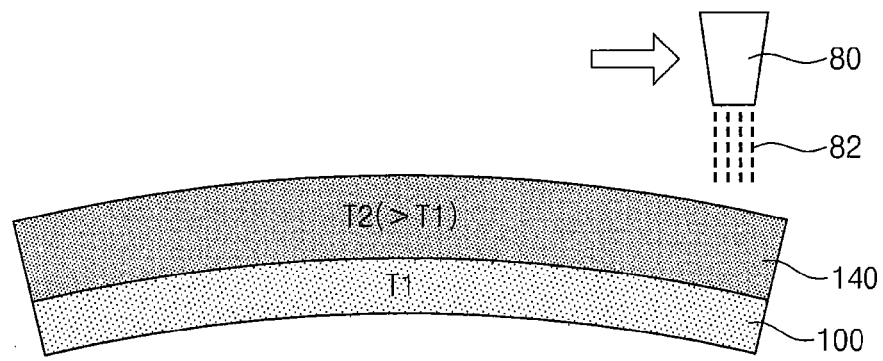
FIGS. 3A and 3B are sectional views illustrating examples of a warpage phenomenon of a semiconductor package, which may occur in a method of fabricating a semiconductor package according to some example embodiments of the inventive concept.
Figure 3B:
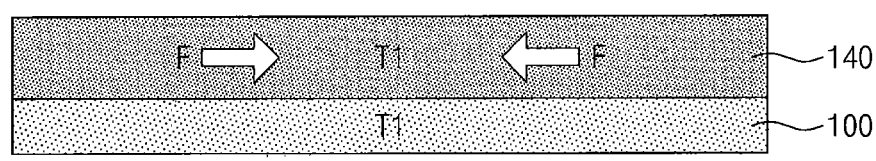

FIGS. 3A and 3B are sectional views illustrating examples of a warpage phenomenon of a semiconductor package, which may occur in methods of fabricating a semiconductor package according to some example embodiments of the inventive concept.

As shown in FIG. 3A, the heat dissipation layer 140 may be formed by providing the mixture 82 onto the base 100, which has a curved profile at a first temperature T1 (e.g., the room temperature of 25° C.), and here, the mixture 82 may be prepared to contain metal powder. For example, the mixture 82 may have a second temperature T2 (e.g., a higher temperature of 150° C. greater than the room temperature). At the second temperature T2, the heat dissipation layer 140 may have the same or similar profile as the base 100, for example, a curved profile.

In the case where the heat dissipation layer 140 is cooled down to a lower temperature (e.g., the first temperature T1) than the second temperature T2, as shown in FIG. 3B, the heat dissipation layer 140 may be shrunken. In this case, the heat dissipation layer 140 may exert a compressive force F to the base 100, and the compressive force F may be used to change the curved profile of the base 100 to a flat profile.

Figure 5A:
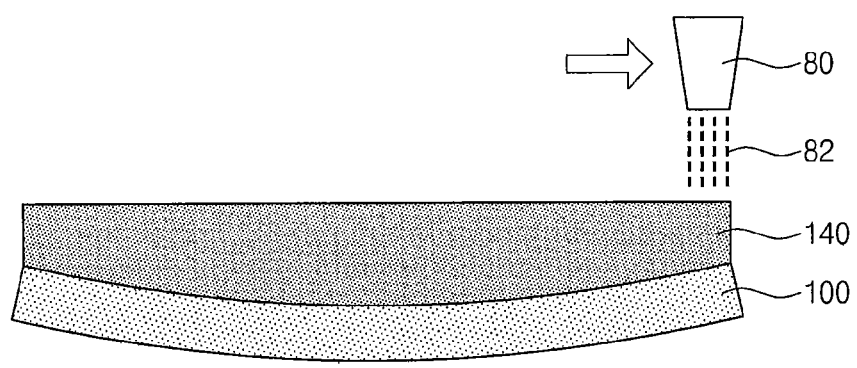
FIGS. 5A through 5C are plan views illustrating a cold spray process of methods of fabricating a semiconductor package according to some example embodiments of the inventive concept.

In the present specification, some example embodiments of the inventive concept will be described with reference to the case, in which the base 100 is convexly curved toward the heat dissipation layer 140, but example embodiments of the inventive concept may not be limited thereto. For example, the shrinkage of the heat dissipation layer 140 may be used to cause a change in warpage state of the base 100 that is convexly curved in a direction away from the heat dissipation layer 140, as shown in FIG. 5A. As another example, in the case where the base 100 has a flat profile at the room temperature, the heat dissipation layer 140 may be formed to have a flat profile.

By controlling a moving speed of the spray nozzle 80 of FIG. 1C and/or a spraying speed or angle of the mixture 82, the heat dissipation layer 140 may be formed to have a uniform thickness, as shown in FIG. 1D. Unlike this, as will be described with reference to FIGS. 4A through 4C, the heat dissipation layer 140 may be formed to have a non-uniform thickness. For example, if there is a spatial variation in an amount of heat generated from the base 100, the heat dissipation layer 140 may be formed to have a thickness that is dependent on, or proportional to, such a spatial variation.

Figure 4A:
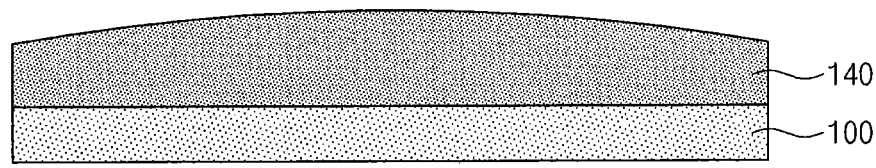
FIGS. 4A through 4C are sectional views illustrating examples of a heat dissipation layer, which may be used in methods of fabricating a semiconductor package according to some example embodiments of the inventive concept.
Figure 4B:
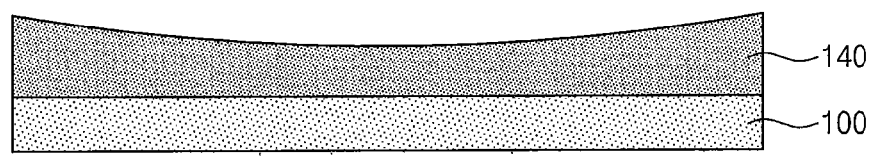
Figure 4C:
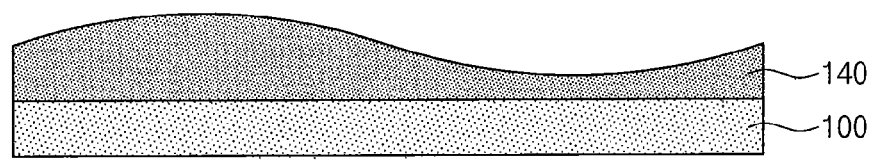

FIGS. 4A through 4C are sectional views illustrating examples of a heat dissipation layer, which may be used in a method of fabricating a semiconductor package according to some example embodiments of the inventive concept.

If heat is mainly generated from a center region of the base 100, the heat dissipation layer 140 may be formed in such a way that a thickness thereof is greater on the center region of the base 100 than on an edge region of the base 100, as shown in FIG. 4A. In such embodiments, the heat dissipation layer 140 may have an upwardly convex section. As another example, as shown in FIG. 4B, the heat dissipation layer 140 may be formed in such a way that a thickness thereof is smaller on the center region of the base 100 than on the edge region of the base 100, thereby having an upwardly concave section. As still another example, as shown in FIG. 4C, the heat dissipation layer 140 may be formed to have a convex section on a portion of the base 100 and a concave section on another portion of the base 100, thereby having a wavy section.

In the cold spray process of FIG. 1C, the heat dissipation layer 140 may be formed to have a non-uniform thickness, as will be described with reference to FIGS. 5A through 5C. The heat dissipation layer 140 shown in FIGS. 5A through 5C may show a metal layer, which is being coated on the package substrate 110 with a curved profile, during the cold spray process of FIG. 1C. By contrast, the heat dissipation layer 140 shown in FIGS. 4A through 4C may show a metal layer, which is in a final stage of a cooling step, as shown in FIG. 1D.

Figure 5B:
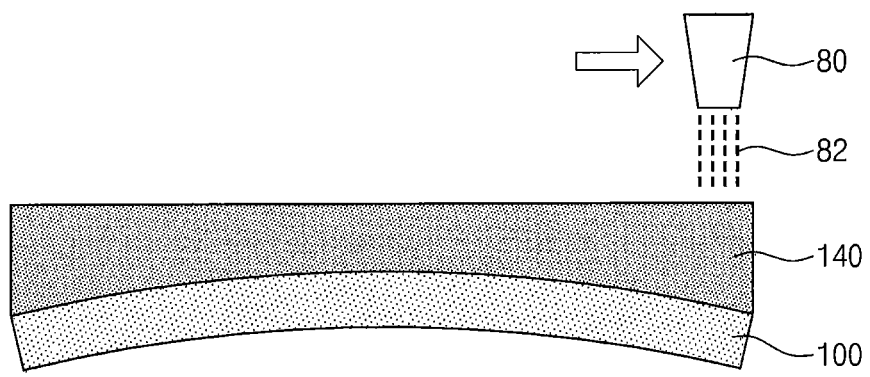
Figure 5C:
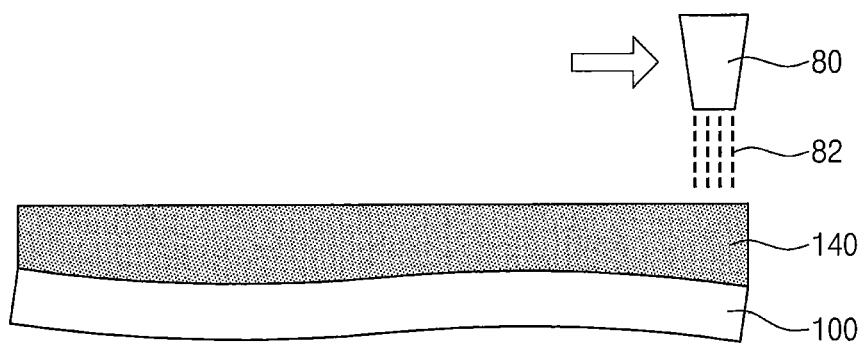

FIGS. 5A through 5C are plan views illustrating a cold spray process of methods of fabricating a semiconductor package according to some example embodiments of the inventive concept.

As shown in FIG. 5A, the spray nozzle 80 may be moved to spray the mixture 82 on the base 100 with a concavely curved profile, and in this case, the heat dissipation layer 140 may be formed to have a non-uniform thickness. Thereafter, in the case where the heat dissipation layer 140 is cooled down, the base 100 may be flattened, allowing a center region of the heat dissipation layer 140 to have a largest thickness, as shown in FIG. 4A.

As another example, the heat dissipation layer 140 may be formed on the base 100 with an upwardly convex profile, and in this case, the heat dissipation layer 140 may have a smallest thickness on the center region thereof, as shown in FIG. 5B. Thereafter, in the case where the heat dissipation layer 140 is cooled down, the base 100 may be flattened, allowing the center region of the heat dissipation layer 140 to have a smallest thickness, as shown in FIG. 4B.

As still another example, the heat dissipation layer 140 may be formed on the base 100 with a wavy profile, as shown in FIG. 5C. Thereafter, in the case where the heat dissipation layer 140 is cooled down, the base 100 may be flattened, allowing the heat dissipation layer 140 to have a wavy sectional profile, as shown in FIG. 4C.

FIGS. 6A through 6E are plan views illustrating examples of a heat dissipation layer, which may be used in methods of fabricating a semiconductor package according to some example embodiments of the inventive concept.

Figure 6A:
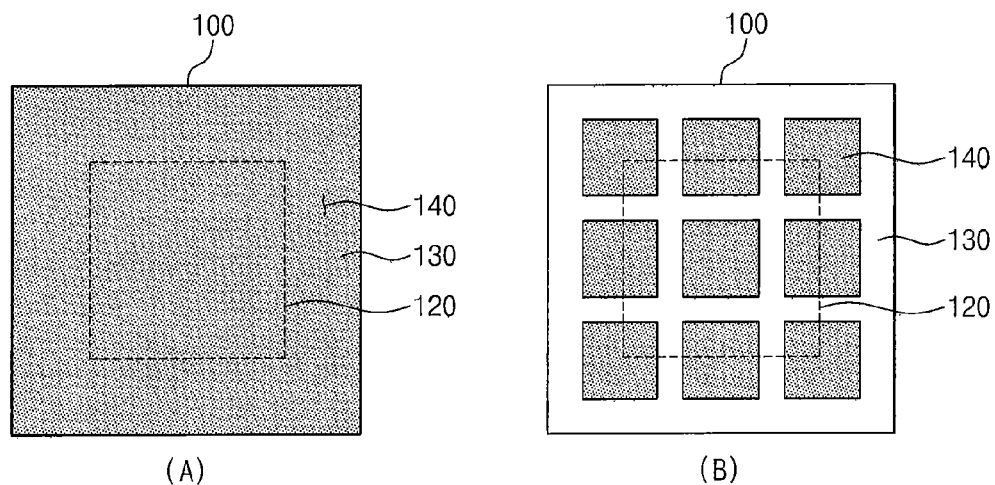
FIGS. 6A through 6E are plan views illustrating examples of a heat dissipation layer, which may be used in methods of fabricating a semiconductor package according to some example embodiments of the inventive concept.

The heat dissipation layer 140 may be provided to cover at least a portion of the base 100 and have various planar shapes, as shown in FIGS. 6A through 6E. As an example, when viewed in a plan view, the heat dissipation layer 140 may be a single plate (A) wholly covering the base 100 or may include a plurality of plates (B) arranged in a matrix shape to partially cover the base 100, as shown in FIG. 6A. In the case where the heat dissipation layer 140 is provided in the form of single plate (A), the heat dissipation layer 140 may cover not only the top surface 120s of the semiconductor chip 120 but also the top surface 130s of the mold layer 130 of FIG. 1D. In the case where the heat dissipation layer 140 is provided to include a plurality of plates (B), the heat dissipation layer 140 may be provided to cover a portion of the top surface 120s of the semiconductor chip 120 of FIG. 1D and a portion of the top surface 130s of the mold layer 130.

Figure 6B:
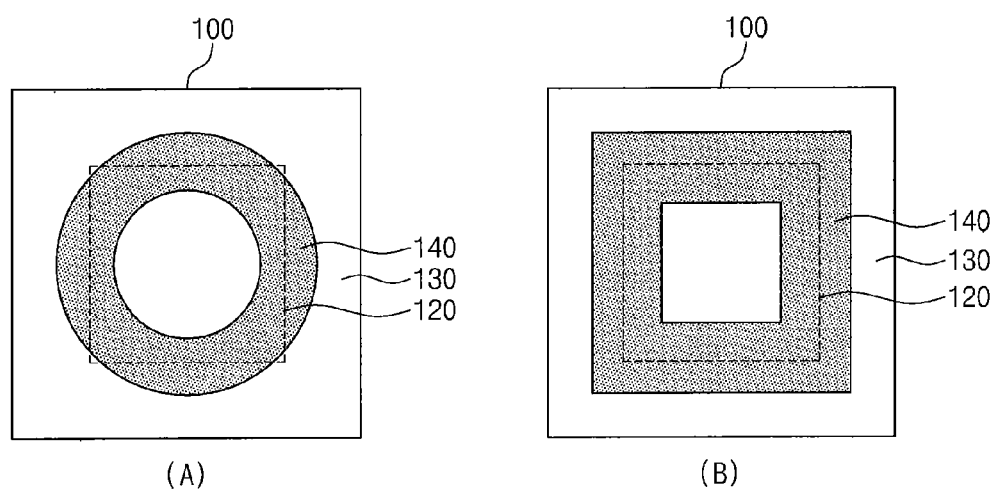
Figure 6C:
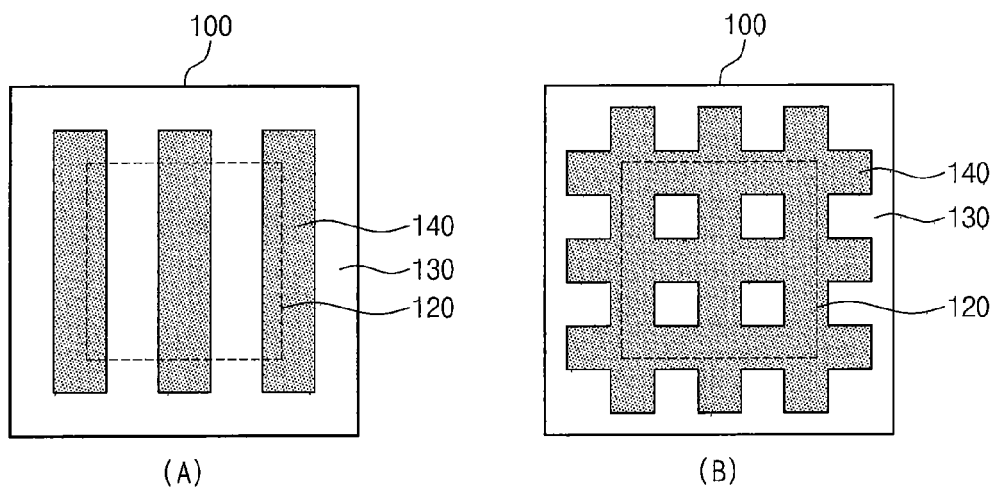
Figure 6D:
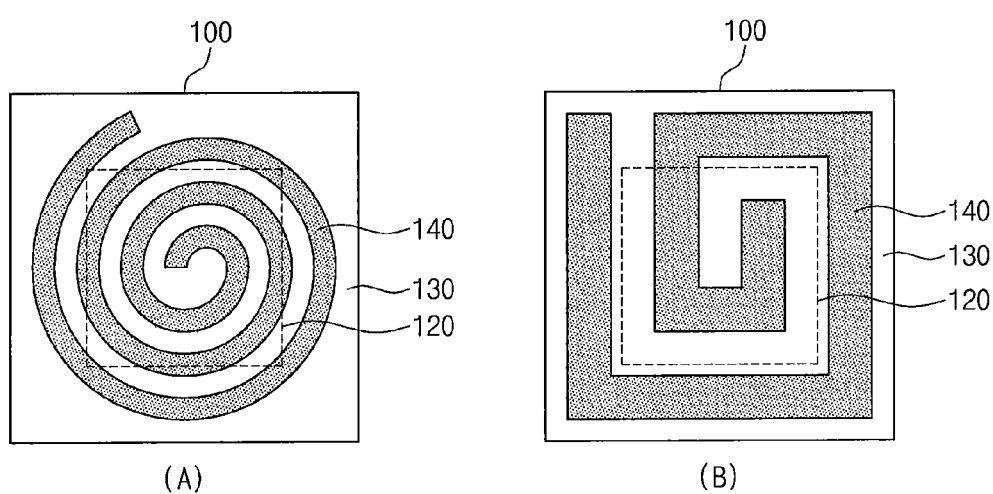
Figure 6E:
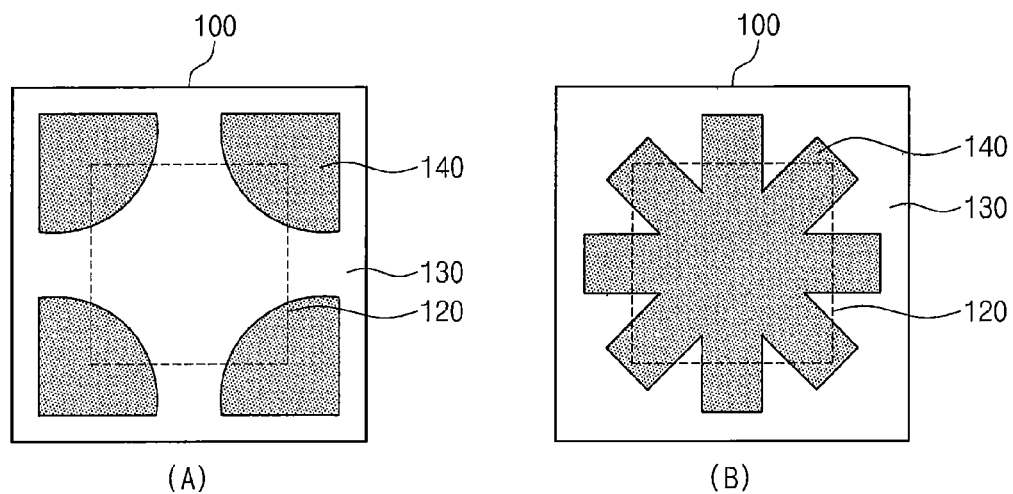

As another example, when viewed in a plan view, the heat dissipation layer 140 may include a circular ring pattern (A) or a rectangular ring pattern (B) partially covering the base 100, as shown in FIG. 6B. As still another example, the heat dissipation layer 140 may include a plurality of parallel stripe patterns (A) or a mesh or grid pattern (B) partially covering the base 100, as shown in FIG. 6C. As still another example, the heat dissipation layer 140 may be a spiral pattern (A) or a rectangular spiral pattern (B) partially covering the base 100, as shown in FIG. 6D. As still another example, the heat dissipation layer 140 may include a plurality of plate shape (A) covering corners of the base 100 or include a star-shaped pattern (B) covering the center region of the base 100, as shown in FIG. 6E.

FIGS. 7A through 7G are sectional views illustrating modified examples of FIG. 1D.

Figure 7A:
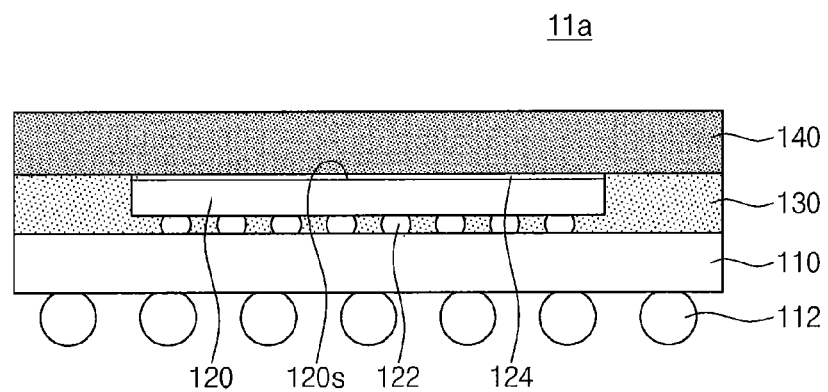
FIGS. 7A through 7G are sectional views illustrating modified examples of FIG. 1D.

Referring to FIG. 7A, a semiconductor package 11a may be fabricated to further include an insulating layer 124 provided between the semiconductor chip 120 and the heat dissipation layer 140. For example, the heat dissipation layer 140 may be formed, after the insulating layer 124 is formed to cover the top surface 120s of the semiconductor chip 120. The top surface 120s of the semiconductor chip 120 may serve as an inactive surface. In some embodiments, the insulating layer 124 may be configured to electrically isolate the semiconductor chip 120 from the heat dissipation layer 140. Accordingly, it is possible to prevent a short circuit from being formed between the semiconductor chip 120 and the heat dissipation layer 140.

Figure 7B:
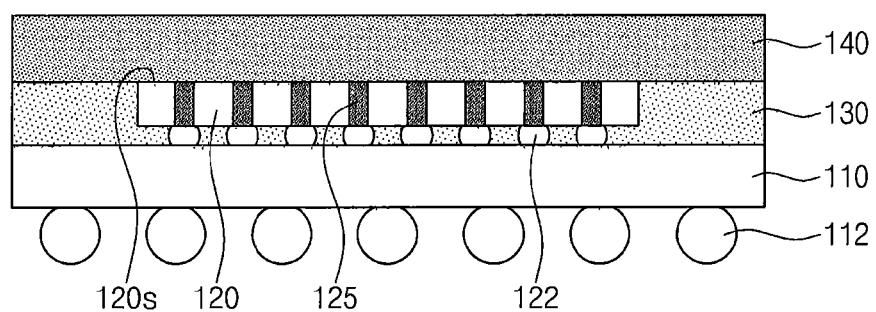

Referring to FIG. 7B, a semiconductor package 11b may be fabricated to further include a plurality of through electrodes 125 vertically passing through at least a portion of the semiconductor chip 120. The top surface 120s of the semiconductor chip 120 may serve as an active surface or an inactive surface. At least one semiconductor chip, whose structural features are substantially identical or similar to those of the semiconductor chip 120, may be further interposed between the semiconductor chip 120 and the package substrate 110 and/or between the semiconductor chip 120 and the heat dissipation layer 140. The heat dissipation layer 140 may be provided to be in direct contact with the top surface 120s (e.g., the inactive surface) of the semiconductor chip 120, but not with the through electrodes 125 which may partially penetrate the semiconductor chip 120. In some embodiments, at least one of the through electrodes 125 may directly contact the heat dissipation layer 140. The through electrode 125 in direct contact with the heat dissipation layer 140 may act as at least one of a heat via and a ground via.

Figure 7C:
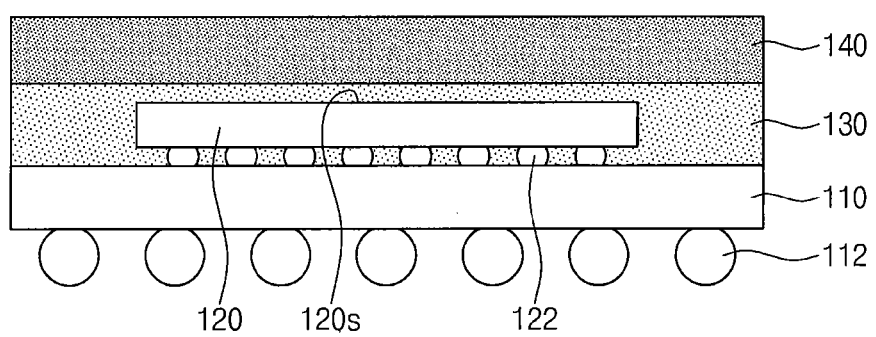

Referring to FIG. 7C, a semiconductor package 11c may be fabricated in such a way that the heat dissipation layer 140 is spaced apart from the top surface 120s of the semiconductor chip 120. For example, the mold layer 130 may be formed on the package substrate 110 to cover the top surface 120s of the semiconductor chip 120, and then, the heat dissipation layer 140 may be formed on the resulting structure. In some embodiments, the mold layer 130 may be provided between the top surface 120s of the semiconductor chip 120 and the heat dissipation layer 140.

Figure 7D:
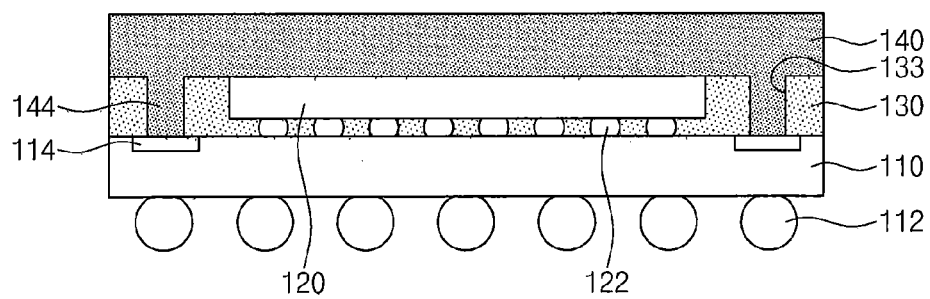

Referring to FIG. 7D, a semiconductor package 11d may be fabricated in such a way that the heat dissipation layer 140 can be used as an EMI shielding layer. In some embodiments, the package substrate 110 may include a ground pad 114, which is provided on an edge region of the top surface thereof, and the mold layer 130 may be provided to have an opening 133 exposing the ground pad 114. In some embodiments, the opening 133 may be formed by a drilling or etching process.

The heat dissipation layer 140 may further include a ground contact 144, which is formed by filling the opening 133 with metal powder. The ground contact 144 may be connected to the ground pads 114. Due to the presence of the heat dissipation layer 140, it is possible to improve heat dissipation, warpage, and EMI characteristics of the semiconductor package 11d.

Figure 7E:
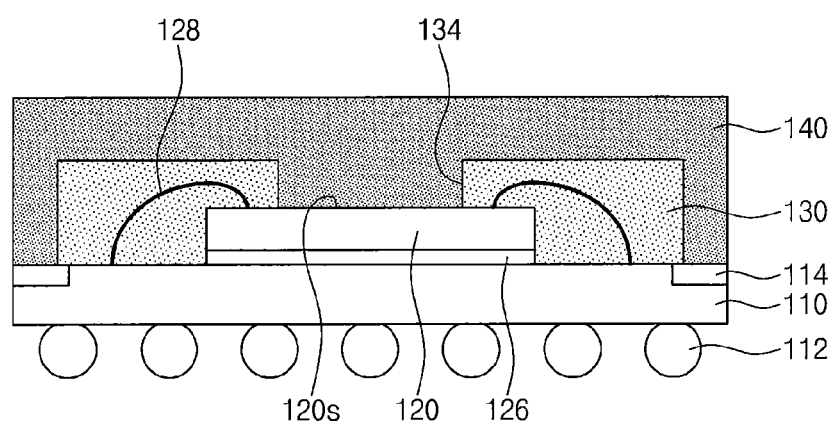

Referring to FIG. 7E, a semiconductor package lie may be fabricated in such a way that the semiconductor chip 120 is mounted on the package substrate 110 through wire bonding. For example, the package substrate 110 may include the ground pad 114 provided on the edge region of the top surface thereof. The semiconductor chip 120 may be mounted on the package substrate 110 by an adhesive layer 126 in such a way that the top surface 120s thereof is oriented toward an upward direction. The top surface 120s of the semiconductor chip 120 may serve as an active surface. The semiconductor chip 120 may be electrically connected to the package substrate 110 through a bonding wire 128. The mold layer 130 may be provided to expose an edge region of the package substrate 110 and to have a hole 134 exposing at least a portion of the top surface 120s of the semiconductor chip 120.

The heat dissipation layer 140 may include a portion filling the hole 134, and thus, the heat dissipation layer 140 may be in direct or indirect contact with the top surface 120s of the semiconductor chip 120. The heat dissipation layer 140 may further include another portion connected to the ground pad 114 of the package substrate 110 and thereby serving as a ground contact. In some embodiments, the heat dissipation layer 140 may be configured to improve heat dissipation, warpage, and EMI shielding characteristics of the semiconductor package lie.

Figure 7F:
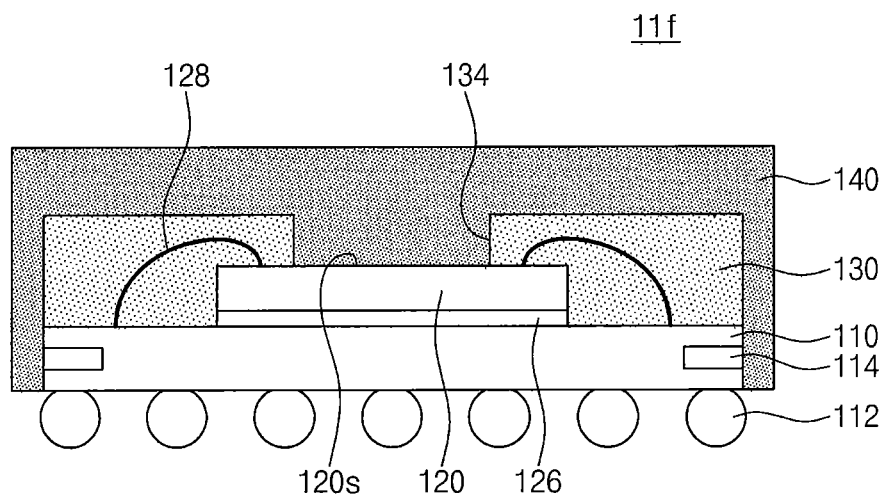

Referring to FIG. 7F, a semiconductor package 11f may be fabricated in such a way that the heat dissipation layer 140 is formed to cover side surfaces of the package substrate 110. For example, the ground pad 114 may be provided on a side surface of the edge region of the package substrate 110. The heat dissipation layer 140 may extend to cover the side surface of the edge region of the package substrate 110 and may be coupled to the ground pad 114. Except for these differences, the semiconductor package 11f may be configured to have substantially the same features as the semiconductor package 11e of FIG. 7E.

Figure 7G:
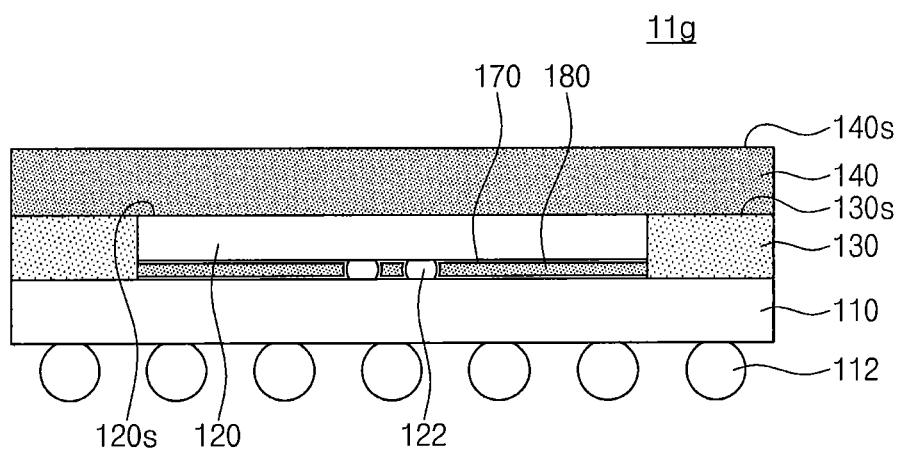

Referring to FIG. 7G, a semiconductor package 11g may be fabricated to further include a conductive under-fill layer 180 provided between the package substrate 110 and the semiconductor chip 120. For example, the semiconductor chip 120 may be mounted on the package substrate 110, and then, a cold spray process may be performed to form the conductive under-fill layer 180. To prevent a short circuit from being formed between the conductive under-fill layer 180 and the semiconductor chip 120 and/or between the conductive under-fill layer 180 and the package substrate 110, an insulating layer 170 may be further formed between the package substrate 110 and the semiconductor chip 120, before the formation of the conductive under-fill layer 180. In some embodiments, thermal resistance between the semiconductor chip 120 and the package substrate 110 may be decreased. According to the afore-described embodiments, the inner terminals 122 may be provided on the center region of the semiconductor chip 120 to have a center pad structure, but example embodiments of the inventive concept may not be limited thereto. For example, the semiconductor chip 120 may be provided to have the inner terminals provided on the edge region of the semiconductor chip 120 and thereby to have an edge pad structure.

FIGS. 8A through 8F are sectional views illustrating methods of fabricating a semiconductor package according to example embodiments of the inventive concept. FIG. 9 is a sectional view illustrating a semiconductor package according to a comparative example.

Figure 8A:
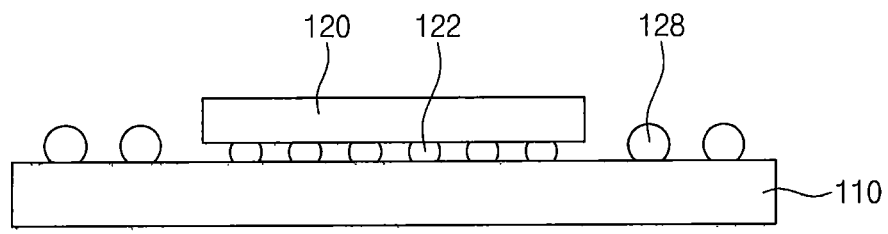
FIGS. 8A through 8F are sectional views illustrating methods of fabricating a semiconductor package according to some example embodiments of the inventive concept.
Figure 9:
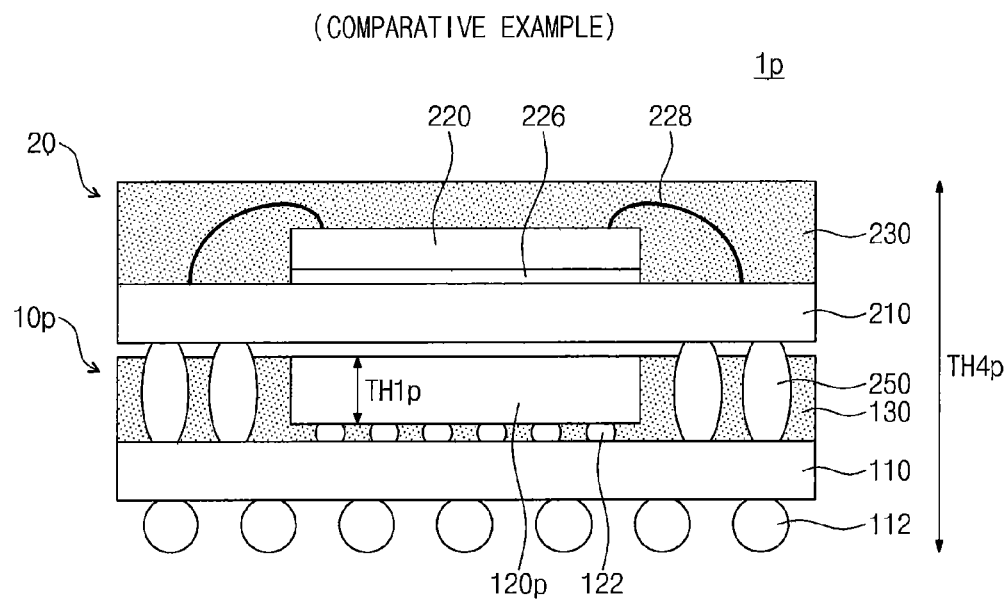
FIG. 9 is a sectional view illustrating a semiconductor package according to a comparative example.

Referring to FIG. 8A, the semiconductor chip 120 may be mounted on the package substrate 110 and may be electrically connected to the package substrate 110 through the inner terminals 122. At least one lower connection terminal 128 (e.g., a solder ball) may be additionally formed on the package substrate 110. The lower connection terminal 128 may be provided outside the semiconductor chip 120.

Figure 8B:
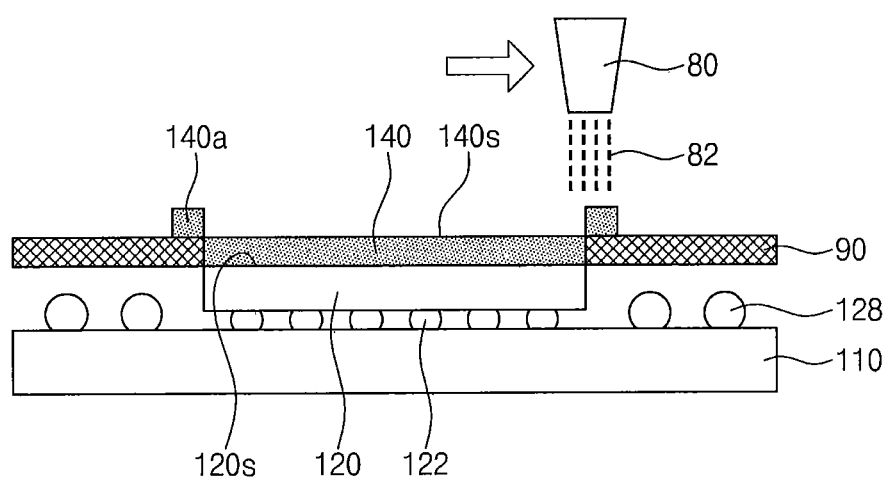

Referring to FIG. 8B, the heat dissipation layer 140 may be formed on the semiconductor chip 120. The heat dissipation layer 140 may be formed by the cold spray process described with reference to FIG. 1C. For example, a mask 90 may be provided on the package substrate 110 to expose the semiconductor chip 120 and veil a region outside the semiconductor chip 120. The mixture 82 of metal powder and gas may be sprayed on the top surface 120s of the semiconductor chip 120 through the spray nozzle 80. The use of the cold spray process using the mask 90 may make it possible to selectively or locally form the heat dissipation layer 140 on the top surface 120s of the semiconductor chip 120.

The cold spray process may allow one of the top surface 120s of the semiconductor chip 120 and the top surface 140s of the heat dissipation layer 140 to have an uneven profile, as previously described with reference to FIGS. 1E through 1H. The heat dissipation layer 140 may be in direct contact with the top surface 120s of the semiconductor chip 120. In certain embodiments, although, during the cold spray process, a remaining layer 140a may be formed on the mask 90, the remaining layer 140a may be removed when the mask 90 is removed.

Figure 8C:
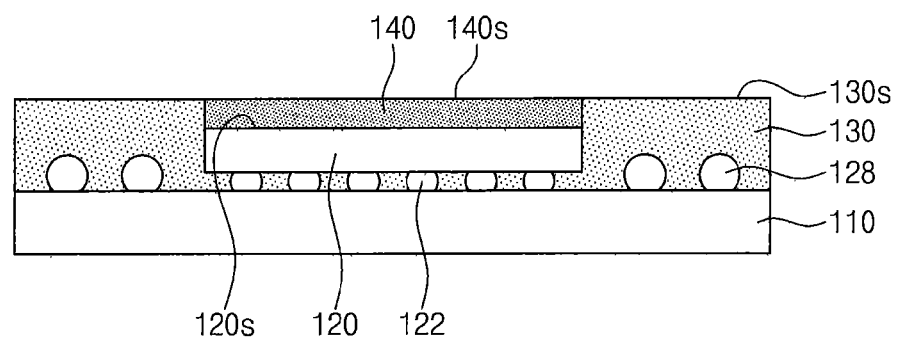

Referring to FIG. 8C, the mold layer 130 may be formed on the package substrate 110 to cover the semiconductor chip 120 and the heat dissipation layer 140. For example, the mold layer 130 may be formed using the mold layer 130. The use of a molded underfill (MUF) process may make it possible to omit a process of forming an insulating under-fill layer between the package substrate 110 and the semiconductor chip 120. As another example, the process of forming the insulating under-fill layer may be further performed before the formation of the mold layer 130. The mold layer 130 may be formed to expose the top surface 140s of the heat dissipation layer 140. The top surface 130s of the mold layer 130 may be coplanar with the top surface 140s of the heat dissipation layer 140. The top surface 130s of the mold layer 130 may have a more flat profile, compared to the top surface 140s of the heat dissipation layer 140 and/or the top surface 120s of the semiconductor chip 120.

Figure 8D:
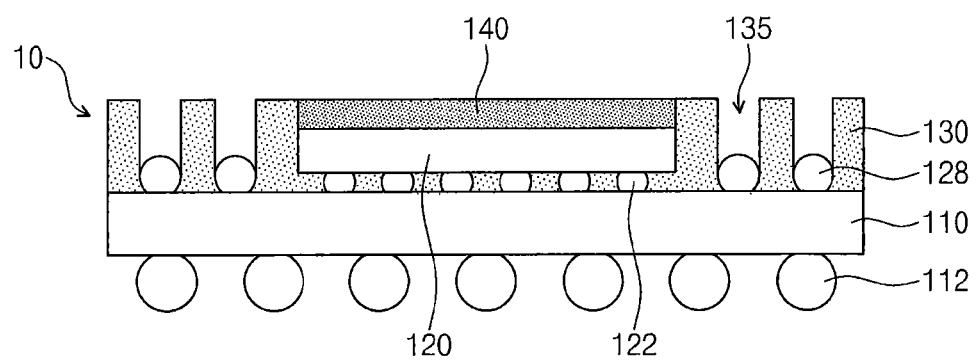

Referring to FIG. 8D, a drilling or etching process may be performed to selectively remove a portion of the mold layer 130 and thereby to form an opening 135 exposing the lower connection terminal 128. The outer terminals 112 (e.g., solder balls) may be attached to the bottom surface of the package substrate 110. As a result, it is possible to fabricate a lower package 10 including the package substrate 110, the semiconductor chip 120 mounted on the package substrate 110, and the heat dissipation layer 140 formed on the semiconductor chip 120.

Figure 8E:
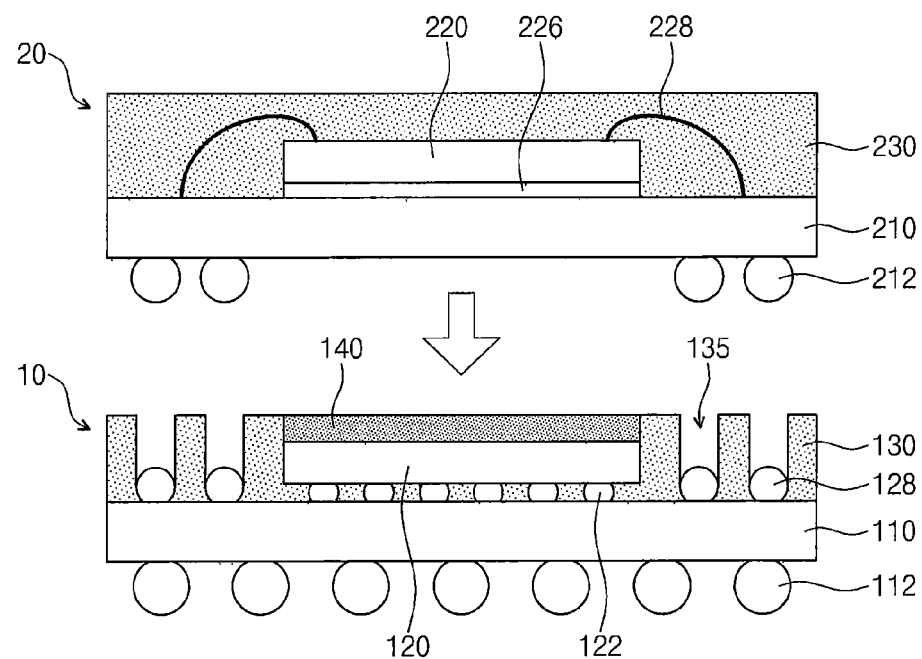

Referring to FIG. 8E, an upper package 20 may be provided. The upper package 20 may include an upper package substrate 210 (e.g., printed circuit board (PCB)), an upper semiconductor chip 220 mounted on the upper package substrate 210, a bonding wire 228 electrically connecting the upper semiconductor chip 220 to the upper package substrate 210, and an upper mold layer 230 covering the upper semiconductor chip 220. The upper semiconductor chip 220 may be attached to the upper package substrate 210 using an adhesive layer 226. The upper semiconductor chip 220 may be provided in the form of a memory chip, a logic chip, or a combination thereof. The upper package 20 may include an upper connection terminal 212, which is aligned to the opening 135 of the mold layer 130. As another example, the upper package 20 may be provided to have substantially the same or similar structure as the lower package 10.

Figure 8F:
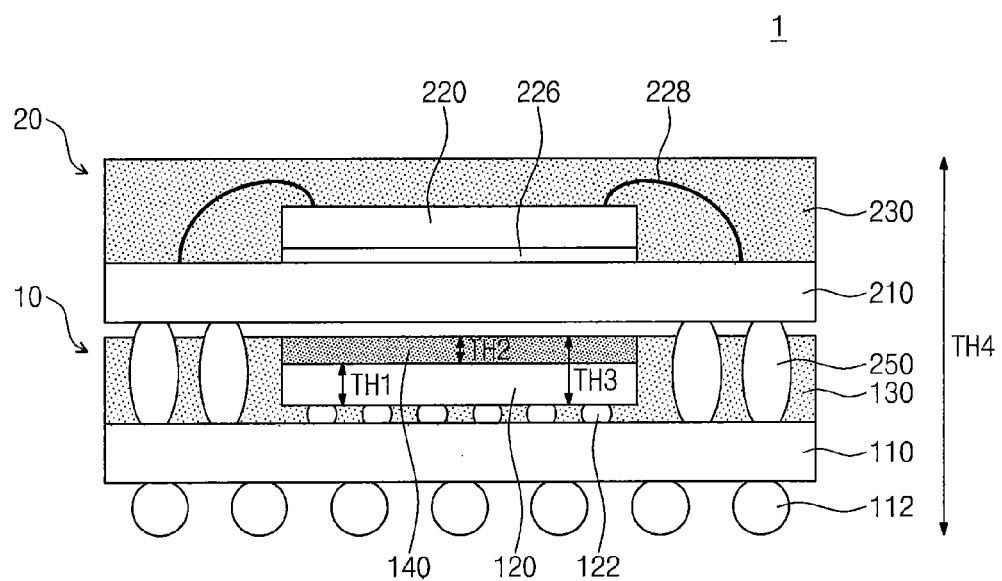

Referring to FIG. 8F, the upper package 20 may be stacked on the lower package 10, and then, a reflow process may be performed on the resulting structure. The reflow process may be performed to melt the lower connection terminal 128 of FIG. 8D and the upper connection terminal 212 and thereby to form a connection terminal 250 electrically connecting the lower package 10 to the upper package 20. As a result, it is possible to fabricate a POP-type semiconductor package 1, in which the upper package 20 is stacked on the lower package 10.

In some embodiments, the heat dissipation layer 140 may be provided on the semiconductor chip 120. In the case where the heat dissipation layer 140 is formed of a highly rigid material, it is possible to adjust or suppress warpage of the lower package 10. Since the heat dissipation layer 140 allows heat generated from the semiconductor chip 120 to be effectively exhausted to the outside, the use of the heat dissipation layer 140 may make it possible to improve heat dissipation characteristics in the lower package 10 and/or the semiconductor package 1. There is no necessity to increase the thickness TH1 of the semiconductor chip 120 for heat dissipation, and thus, it is possible to reduce a thickness TH4 of the semiconductor package 1. Technical issues associated with such a thickness reduction will be described with reference to FIG. 9.

Referring to FIG. 9, unlike the embodiment described herein, a PoP-type semiconductor package 1p may be fabricated to include the upper package 20 stacked on a lower package 10p, but a heat dissipation layer may not be provided in the semiconductor package 1p. In this case, in order to achieve desired performance in heat dissipation of the lower package 10p and/or semiconductor package 1p, it is necessary to increase a thickness TH1p of the semiconductor chip 120p.

By increasing the thickness TH1p of the semiconductor chip 120p, it is possible to reduce thermal spreading resistance of the lower package 10p and/or the semiconductor package 1p. This means that, in order to increase the heat dissipation characteristics of the lower package 10p and/or the semiconductor package 1p, it is necessary to increase the thickness TH1p of the semiconductor chip 120p. However, in the case where the thickness TH1p of the semiconductor chip 120p is increased for improvement of the heat dissipation characteristics, a thickness TH4p of the semiconductor package 1p may also be increased.

By contrast, according to some example embodiments of the inventive concept, the heat dissipation layer 140 provided on the semiconductor chip 120 may make it possible to reduce the thermal spreading resistance, even when the thickness TH1 of the semiconductor chip 120 is less than the thickness TH1p of the semiconductor chip 120p. That is, owing to the heat dissipation layer 140 provided on the semiconductor chip 120, there is no necessity to increase the thickness TH1 of the semiconductor chip 120 for improvement of the heat dissipation characteristics, and thus, it is possible to reduce or minimize the thickness TH4 of the semiconductor package 1.

Referring back to FIG. 8F, the thickness TH2 of the heat dissipation layer 140 may be less than the thickness TH1 of the semiconductor chip 120. As an example, the thickness TH2 of the heat dissipation layer 140 may range from about 25% to about 70% of the thickness TH1 of the semiconductor chip 120. As an example, the thickness TH1 of the semiconductor chip 120 may be about 100 μm, and the thickness TH2 of the heat dissipation layer 140 may range from about 25 μm to about 70 μm, but example embodiments of the inventive concept may not be limited thereto. A total thickness TH3 (i.e., TH1+TH2) of the semiconductor chip 120 and the heat dissipation layer 140 may be equal to or less than the thickness TH1p of the semiconductor chip 120p of FIG. 9. The thickness TH4 of the semiconductor package 1 may be equal to or less than the thickness TH4p of the semiconductor package 1p.

Figure 10A:
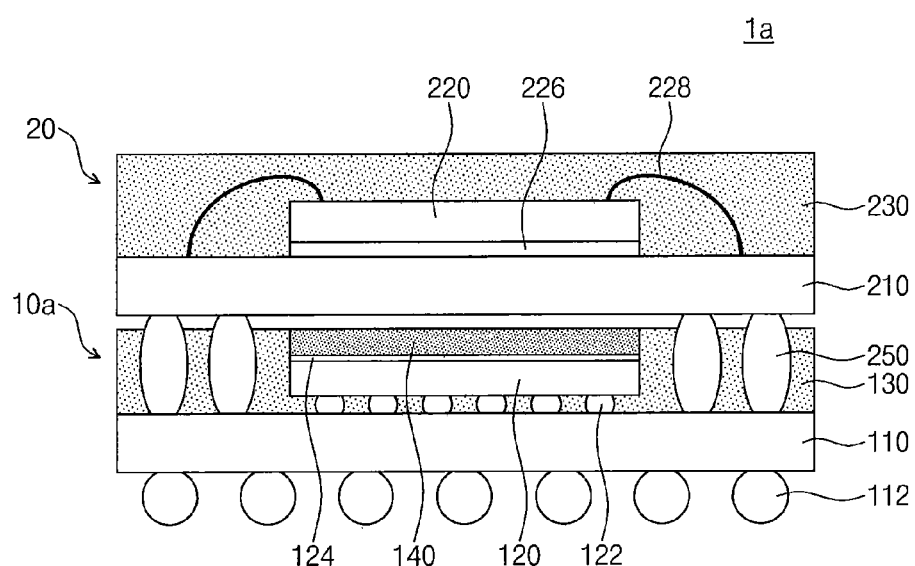
FIGS. 10A and 10B are sectional views illustrating modified examples of FIG. 8F.
Figure 10B:
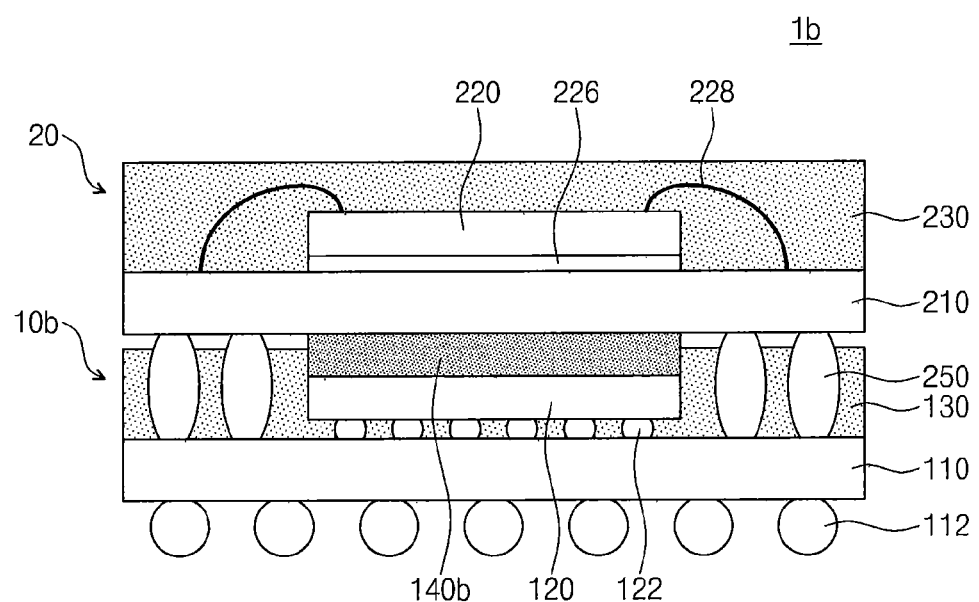
Figure 10C:
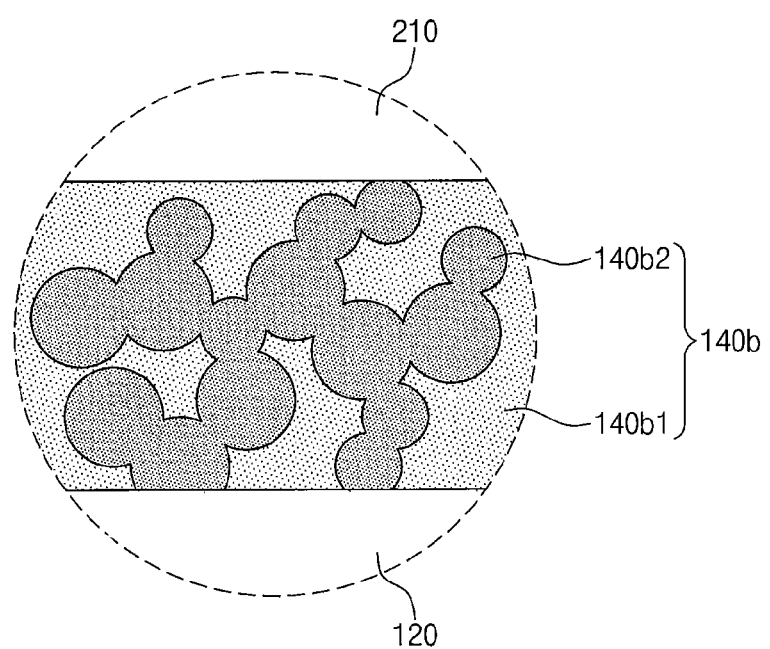
FIG. 10C is an enlarged sectional view illustrating a portion of FIG. 10B.

FIGS. 10A and 10B are sectional views illustrating modified examples of FIG. 8F. FIG. 10C is an enlarged sectional view illustrating a portion of FIG. 10B.

Referring to FIG. 10A, a semiconductor package 1a may be fabricated by stacking the upper package 20 on a lower package 10a. Some embodiments provide that the lower package 10a may be prepared to include the insulating layer 124 interposed between the semiconductor chip 120 and the heat dissipation layer 140. By providing the insulating layer 124, it is possible to prevent a short circuit from being formed between the semiconductor chip 120 and the heat dissipation layer 140.

Referring to FIG. 10B, a semiconductor package 1b may be fabricated by stacking the upper package 20 on a lower package 10b, and here, the lower package 10b may be prepared to include the heat dissipation layer 140b in contact with the upper package substrate 210. The heat dissipation layer 140b may allow heat generated in the semiconductor chip 120 to be effectively exhausted to the outside through the upper package substrate 210 thereon, and thus, it is possible to achieve effective heat dissipation characteristics. The heat dissipation layer 140b may include a first metallic portion 140b1 with a lower melting point and a second metallic portion 140b2 with a higher melting point, as shown in FIG. 10C. As an example, the first metallic portion 140b1 may contain solder, and the second metallic portion 140b2 may contain copper. The first metallic portion 140b1 may make it possible to reduce adhesion resistance between the lower package 10b and the upper package 20 and thereby to enhance adhesion strength of the heat dissipation layer 140b, and the second metallic portion 140b2 may make it possible to reduce thermal resistance and thereby to enhance heat dissipation characteristics of the heat dissipation layer 140b.

Figure 12A:
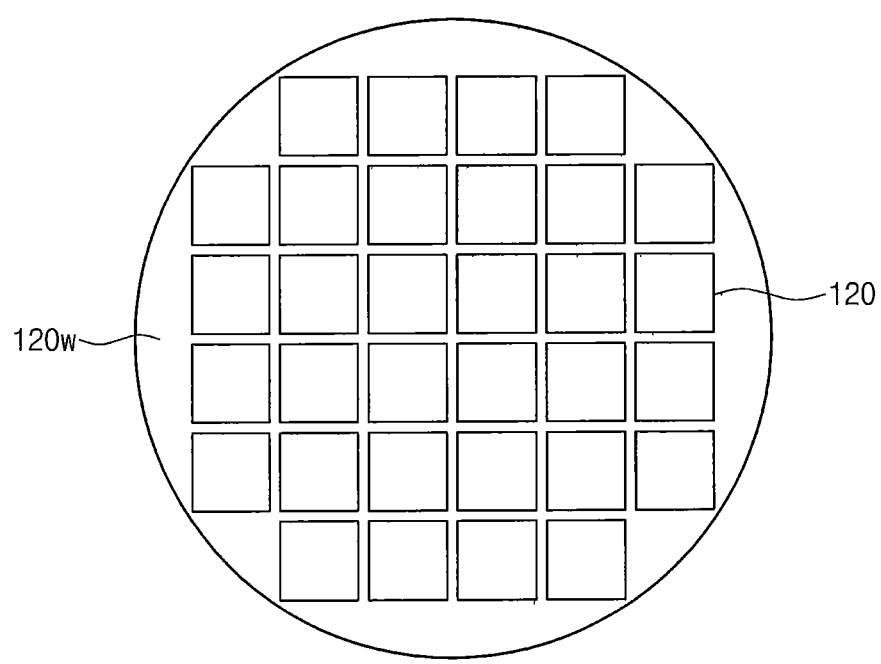
FIGS. 12A through 12C are plan views illustrating modified examples of FIGS. 11A through 11C.
Figure 12B:
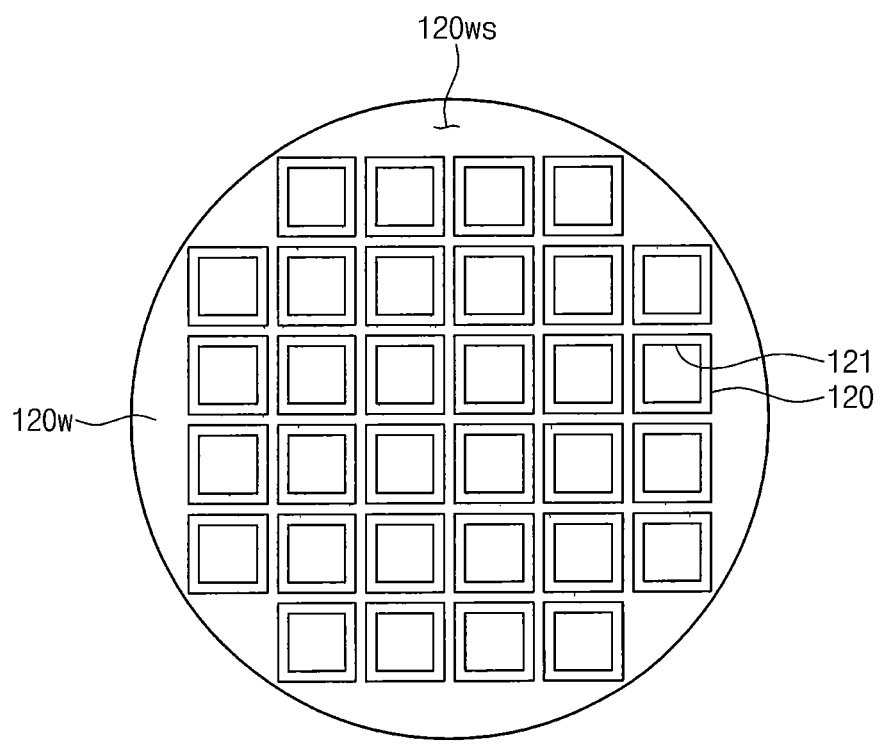
Figure 12C:
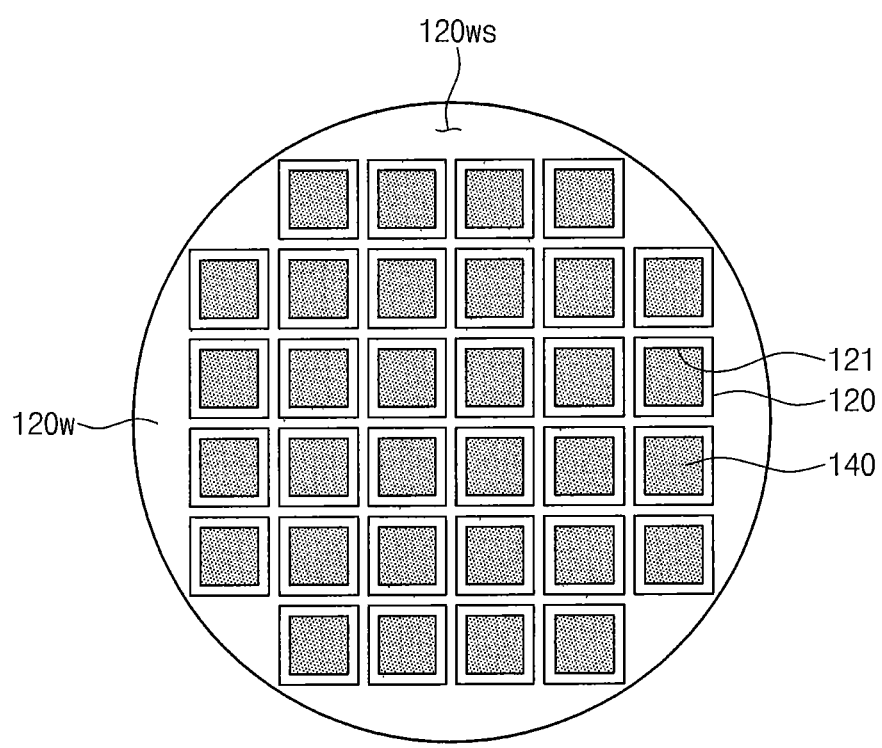
Figure 13A:
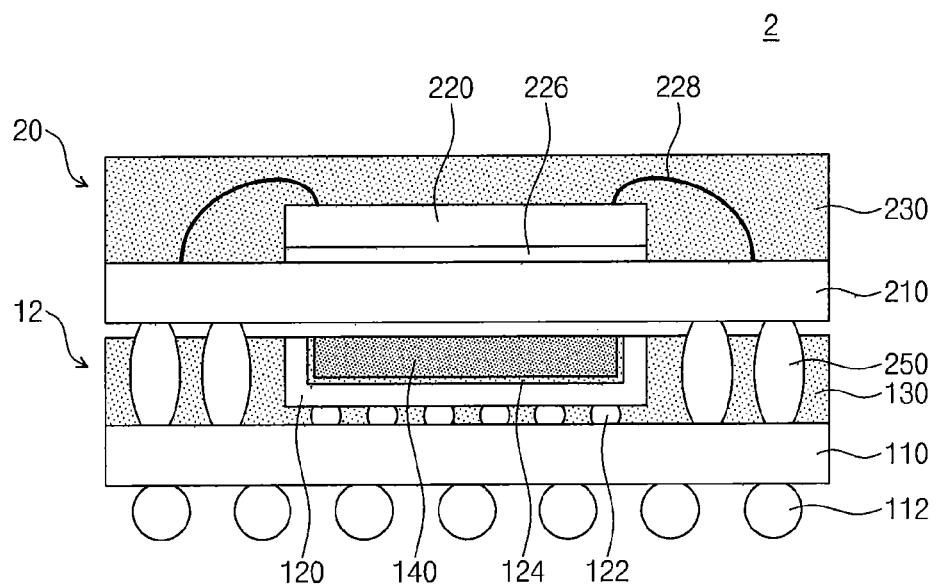
FIG. 13A is a sectional view illustrating a package-on-package (PoP) semiconductor package including the semiconductor package of FIG. 11D.
Figure 13B:
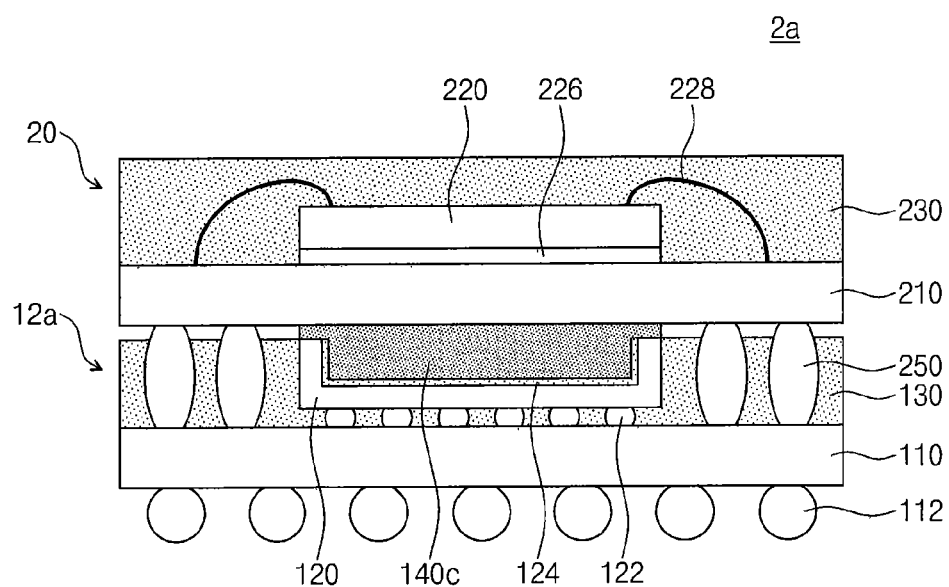
FIG. 13B is a sectional view illustrating a modified example of FIG. 13A.

FIGS. 11A through 11D are sectional views illustrating a method of fabricating a semiconductor package according to some example embodiments of the inventive concept. FIGS. 12A through 12C are plan views illustrating modified examples of FIGS. 11A through 11C. FIG. 13A is a sectional view illustrating a package-on-package (PoP) semiconductor package including the semiconductor package of FIG. 11D. FIG. 13B is a sectional view illustrating a modified example of FIG. 13A.

Figure 11A:
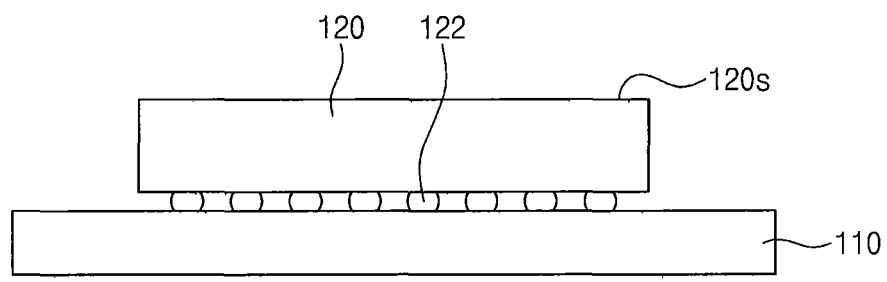
FIGS. 11A through 11D are sectional views illustrating methods of fabricating a semiconductor package according to some example embodiments of the inventive concept.

Referring to FIG. 11A, the semiconductor chip 120 may be mounted on the package substrate 110 and may be electrically connected to the package substrate 110 via the inner terminals 122. The top surface 120s may serve as an inactive surface of the semiconductor chip 120.

Figure 11B:
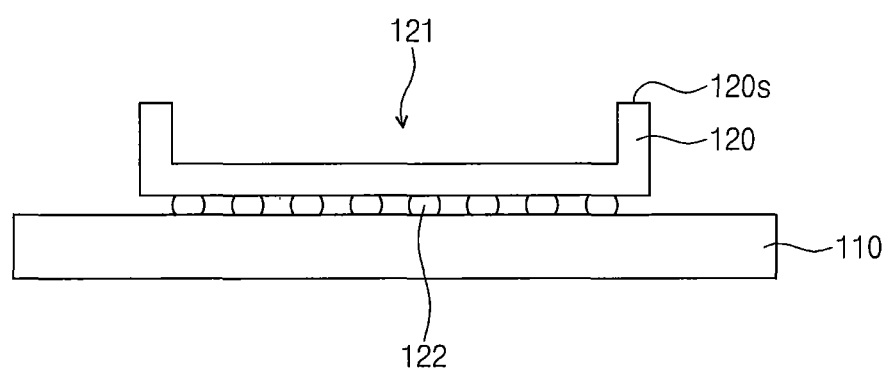

Referring to FIG. 11B, a cavity 121 may be provided in the semiconductor chip 120. As an example, an etching process may be performed to partially remove the top surface 120s of the semiconductor chip 120 and thereby to form the cavity 121 recessed in a direction from the top surface 120s of the semiconductor chip 120 toward the package substrate 110.

Figure 11C:
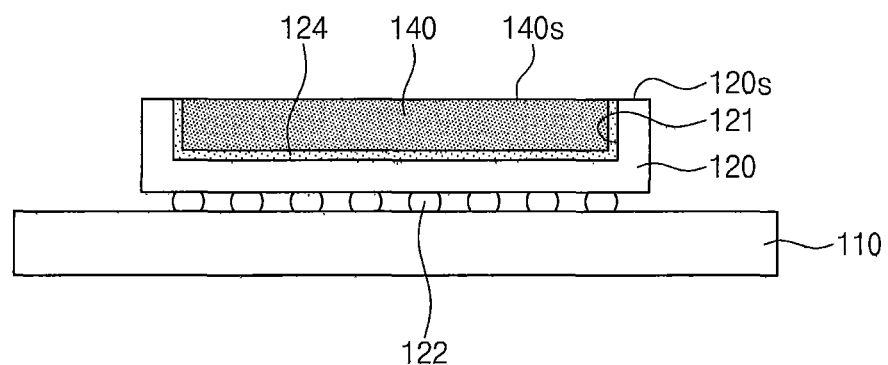

Referring to FIG. 11C, the heat dissipation layer 140 may be formed to fill the cavity 121, after the formation of the insulating layer 124 in the cavity 121. The heat dissipation layer 140 may be formed by the cold spray process described with reference to FIG. 1C. The top surface 140s may serve as an uneven surface of the heat dissipation layer 140, and the top surface 120s may serve as an even surface of the semiconductor chip 120. The interface between the heat dissipation layer 140 and the insulating layer 124 may be an uneven surface.

Figure 11D:
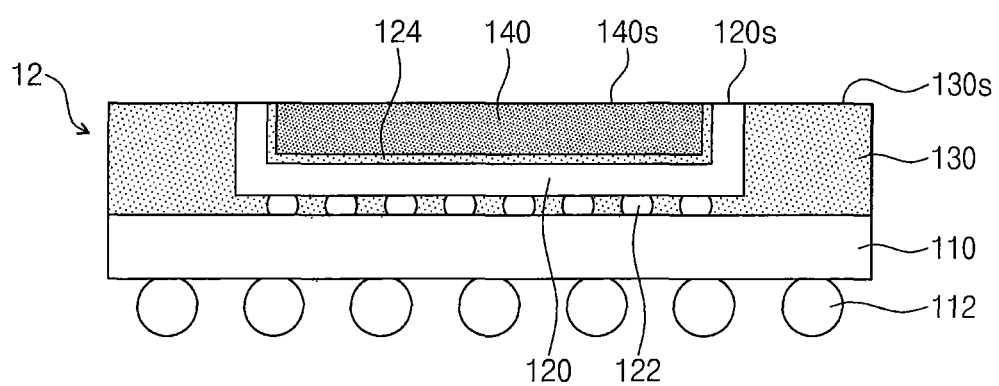

Referring to FIG. 11D, the mold layer 130 may be formed on the package substrate 110 to enclose the semiconductor chip 120. The mold layer 130 may be formed to expose not only the top surface 140s of the heat dissipation layer 140 but also the top surface 120s of the semiconductor chip 120. The top surface 130s of the mold layer 130 may be formed to be coplanar with the top surface 140s of the heat dissipation layer 140 and/or the top surface 120s of the semiconductor chip 120. The top surface 130s of the mold layer 130 may be an even surface. As a result of the above process, it is possible to fabricate a semiconductor package 12, in which the semiconductor chip 120 embedded with the heat dissipation layer 140 is bonded to the package substrate 110 in a flip-chip bonding manner. Here, since the heat dissipation layer 140 is embedded in the semiconductor chip 120, it is possible to suppress warpage of the semiconductor chip 120 and moreover to reduce the thickness of the semiconductor package 12.

Unlike that described with reference to FIGS. 11A through 11C, the cavity 121 and the heat dissipation layer 140 may be formed in a wafer level. For example, as shown in FIG. 12A, a fabrication process may be performed on a wafer 120w to fabricate a plurality of the semiconductor chips 120. Thereafter, as shown in FIG. 12B, a surface 120ws of the wafer 120w corresponding to the top surface 120s of the semiconductor chip 120 may be selectively etched to form the cavities 121 in the semiconductor chips 120, respectively. As shown in FIG. 12C, an insulating layer (e.g., 124 of FIG. 11C) may be formed in the cavity 121, and then, a cold spray process may be performed to form the heat dissipation layer 140 filling the cavity 121. In certain embodiments, a grinding process may be performed on the surface 120ws of the wafer 120w provided with the heat dissipation layer 140 to remove the insulating layer or the heat dissipation layer from regions other than the cavity 121.

A sawing process may be performed to divide the wafer 120w into the semiconductor chips 120 embedded with the heat dissipation layer 140. Thereafter, each of the semiconductor chips 120 divided by the sawing process may be bonded to the package substrate 110 (for example, in a flip-chip bonding manner), and the mold layer 130 may be formed on the resulting structure. As a result, the semiconductor package 12 of FIG. 11D may be fabricated.

Referring to FIG. 13A, the upper package 20 may be stacked on the semiconductor package 12 (hereinafter, referred to as to a lower package) to fabricate a PoP-type semiconductor package 2. In some embodiments, the connection terminal 250 may be further formed to electrically connect the lower package 12 to the upper package 20.

Referring to FIG. 13B, a semiconductor package 2a may be fabricated by stacking the upper package 20 on a lower package 12a, and here, the lower package 12a may be prepared to include the heat dissipation layer 140c in contact with the upper package substrate 210. Since the heat dissipation layer 140c is provided to be in contact with the upper package substrate 210, it is possible to improve heat dissipation characteristics of the semiconductor package 2a. The heat dissipation layer 140c may include metallic portions with different melting points, as previously described with reference to FIG. 10C.

Figure 14A:
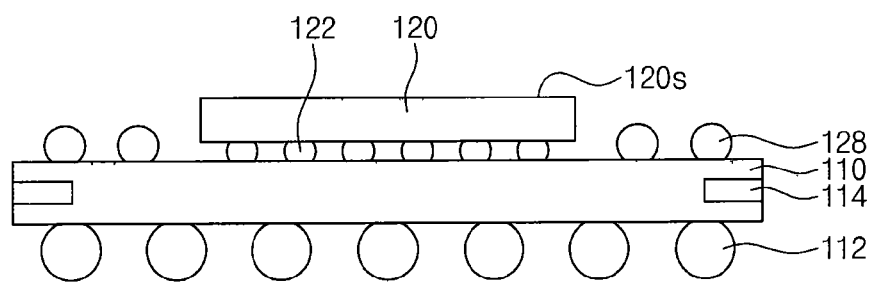
FIGS. 14A through 14D and 14F are sectional views illustrating methods of fabricating a semiconductor package according to some example embodiments of the inventive concept.
Figure 14B:
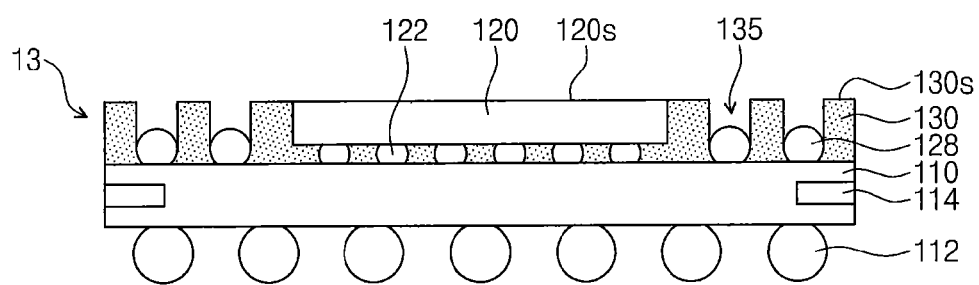
Figure 14C:
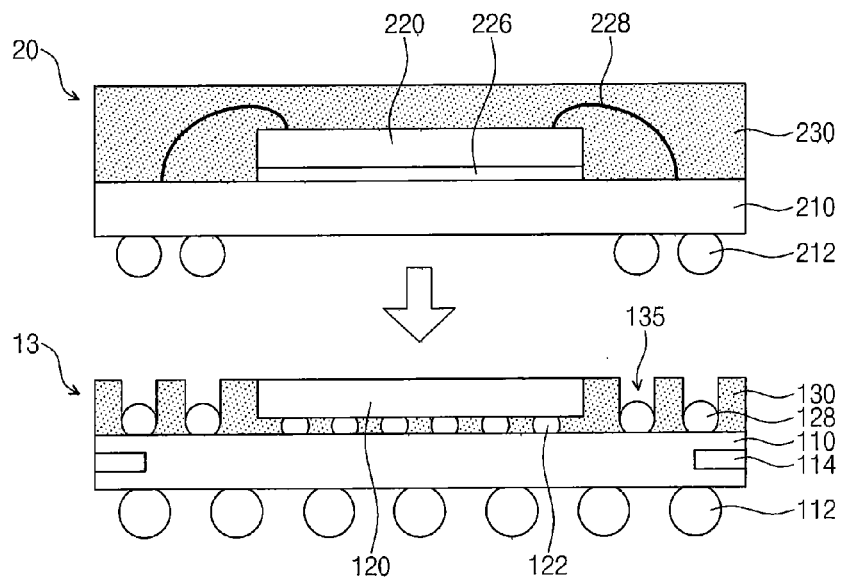
Figure 14D:
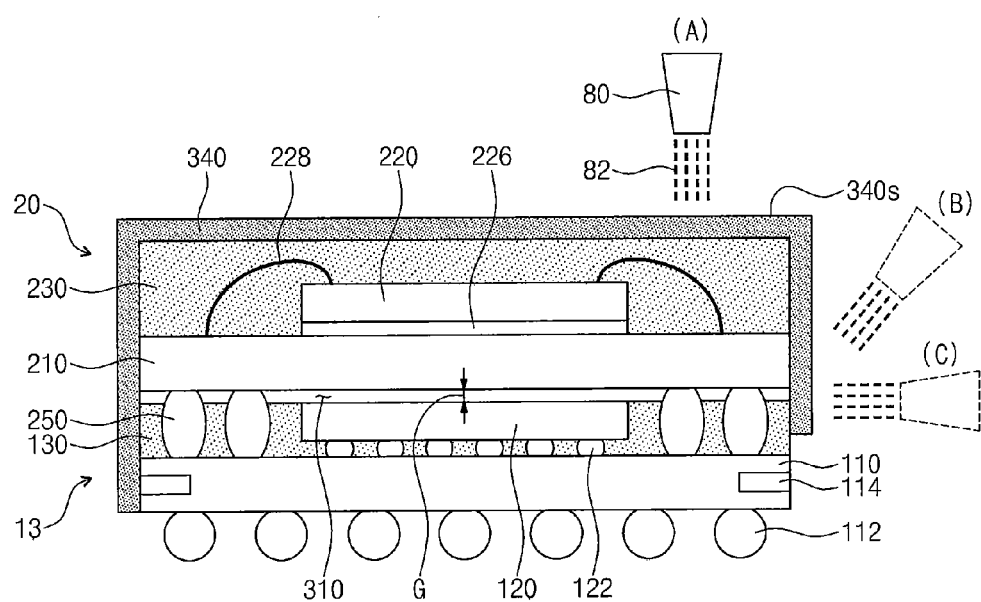
Figure 14E:
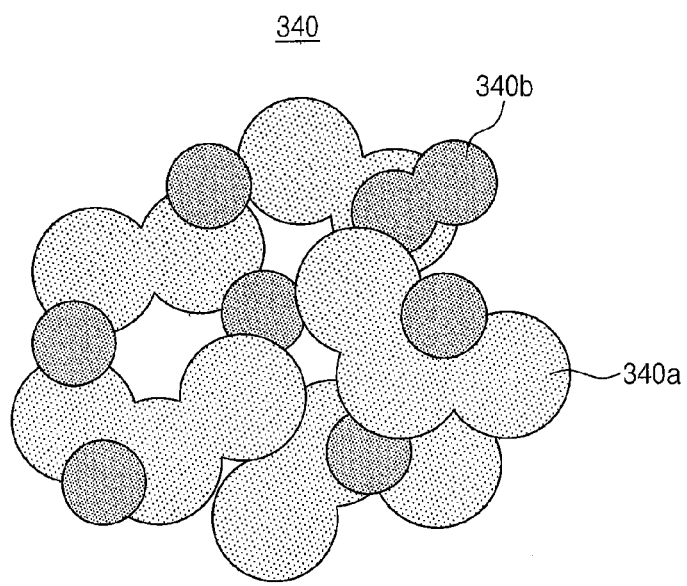
FIG. 14E is an enlarged sectional view illustrating a portion of FIG. 14D.

FIGS. 14A through 14F are sectional views illustrating methods of fabricating a semiconductor package according to some example embodiments of the inventive concept. FIG. 14E is an enlarged sectional view illustrating a portion of FIG. 14D.

Referring to FIG. 14A, the semiconductor chip 120 may be mounted on the package substrate 110 and may be electrically connected to the package substrate 110 via the inner terminals 122. At least one lower connection terminal 128 (e.g., a solder ball) may be further provided on the package substrate 110. In some embodiments, the ground pad 114 may be provided on or in a side surface of the edge region of the package substrate 110. The top surface 120s of the semiconductor chip 120 may serve as an inactive surface.

Referring to FIG. 14B, the mold layer 130 may be formed on the package substrate 110 to cover the semiconductor chip 120, and a portion of the mold layer 130 may be selectively removed to form the opening 135 exposing the lower connection terminal 128. The mold layer 130 may be formed by, for example, an MUF process, and the opening 135 may be formed by, for example, a drilling or etching process. The mold layer 130 may have the top surface 130s, which is substantially coplanar with the top surface 120s of the semiconductor chip 120. At least one outer terminal 112 (e.g., a solder ball) may be attached to the bottom surface of the package substrate 110. As a result, it is possible to fabricate a lower package 13 including the package substrate 110, the semiconductor chip 120 mounted on the package substrate 110, and the mold layer 130 covering the semiconductor chip 120.

Referring to FIG. 14C, the upper package 20 may be provided. The upper package 20 may include the upper semiconductor chip 220, which is bonded to the upper package substrate 210 via the bonding wire 228, covered with the upper mold layer 230, and attached to the upper package substrate 210 by the adhesive layer 226. The upper connection terminal 212 may be provided on a bottom surface of the upper package substrate 210 and may be aligned to the opening 135 of the mold layer 130.

Referring to FIG. 14D, the upper package 20 may be stacked on the lower package 13, and then, a reflow process may be performed on the resulting structure. The reflow process may be performed to melt the lower connection terminal 128 of FIG. 14C and the upper connection terminal 212 and thereby to form a connection terminal 250 electrically connecting the lower package 13 to the upper package 20.

Thereafter, a shielding layer 340 may be provided to enclose the lower package 13 and the upper package 20 and thereby to prevent and/or reduce electromagnetic interference. The shielding layer 340 may be formed by the cold spray process described with reference to FIG. 1C. The spray nozzle 80 may be configured to spray the mixture 82 of metal powder and gas on the upper package 20 in a vertical state (A). Also, the spray nozzle 80 may be configured to spray the mixture 82 on side surfaces of the lower package 13 and the upper package 20 in an inclined state (B) or a horizontal state (C).

The shielding layer 340 may be configured to have substantially the same features and surface roughness as those of the heat dissipation layer 140 described with reference to FIGS. 1E through 1H. For example, the shielding layer 340 may be a single or multiple layer containing copper or aluminum. At least one of a surface 340s of the shielding layer 340, the interface between the shielding layer 340 and the upper package 20, or the interface between the shielding layer 340 and the lower package 13 may be uneven.

In some embodiments, as shown in FIG. 14E, the shielding layer 340 may include a first metallic portion 340a and a second metallic portion 340b. As an example, the first metallic portion 340a may contain copper (Cu), and the second metallic portion 340b may contain ferrite. As another example, the shielding layer 340 may include one of the first metallic portion 340a and the second metallic portion 340b. The first and second metallic portions 340a and 340b may have a size (e.g., a diameter) that is greater than a size G of a gap 310 formed between the upper and lower packages 20 and 13. For example, the size G of the gap 310 may range from about 10 µm to about 50 µm, and the first and second metallic portions 340a and 340b may have a size larger than the size G of a gap 310. In this case, it is possible to prevent the shielding layer 340 from being extended into the gap 310 and thereby to prevent a short circuit from being formed between the shielding layer 340 and the connection terminal 250.

Figure 14F:
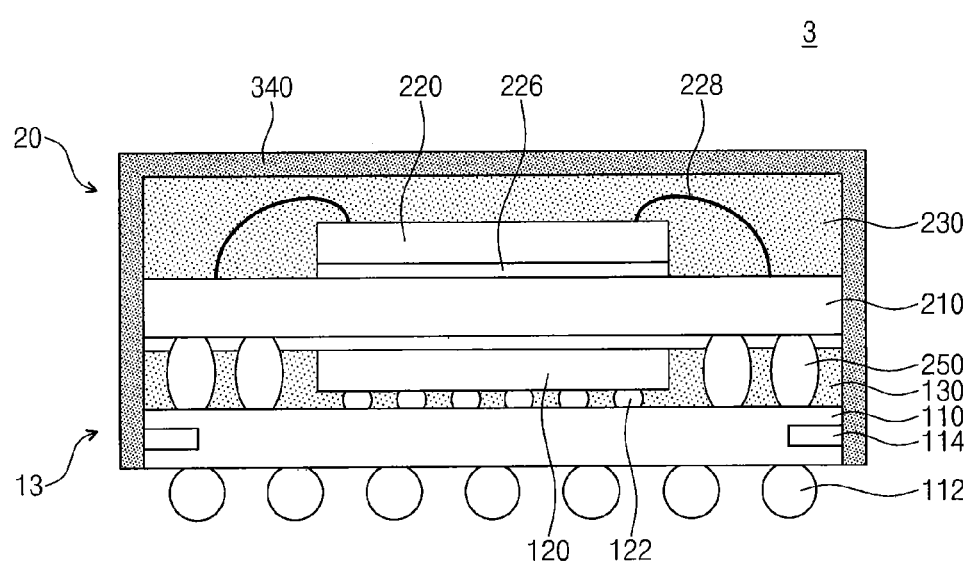

Referring to FIG. 14F, as a result of the above process, a semiconductor package 3 may be fabricated to include the lower package 13, the upper package 20 stacked on the lower package 13, and the shielding layer 340 encapsulating the lower and upper packages 13 and 20. The shielding layer 340 may be electrically connected to the ground pad 114. Due to the presence of the shielding layer 340, it is possible to increase rigidity of the semiconductor package 3 and improve EMI characteristics of the semiconductor package 3. The structure of the semiconductor package 3 may be variously modified, as will be described with reference to FIGS. 15A through 15D.

FIGS. 15A through 15D are sectional views illustrating modified examples of FIG. 14F.

Figure 15A:
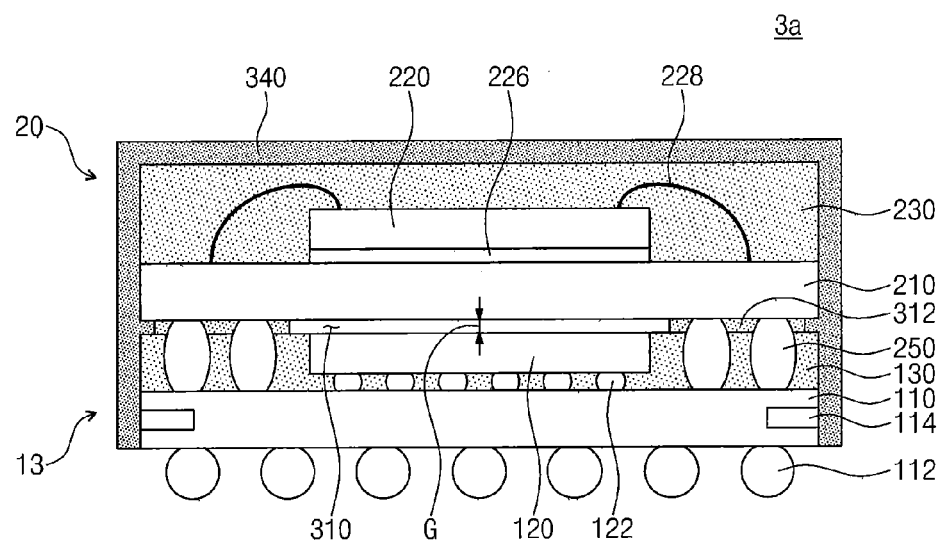
FIGS. 15A through 15D are sectional views illustrating modified examples of FIG. 14F.

Referring to FIG. 15A, a semiconductor package 3a may be fabricated to include an insulating layer 312 partially filling the gap 310 between the lower and upper packages 13 and 20. As an example, metal particles constituting the shielding layer 340 may have a size that is equal to or smaller than the size G of the gap 310, and in this case, some of the metal particles may be flowed into the gap 310 to form the shielding layer 340 filling at least a portion of the gap 310. In the case where the shielding layer 340 is formed in the gap 310, the shielding layer 340 may be connected to the connection terminal 250; that is, a short circuit may be formed through the shielding layer 340. To prevent occurrence of the short circuit, the insulating layer 312 may be additionally formed in the gap 310 to enclose the connection terminal 250. The insulating layer 312 may prevent the connection terminal 250 from being in contact with the shielding layer 340, even when the shielding layer 340 is partially formed in the gap 310.

Figure 15B:
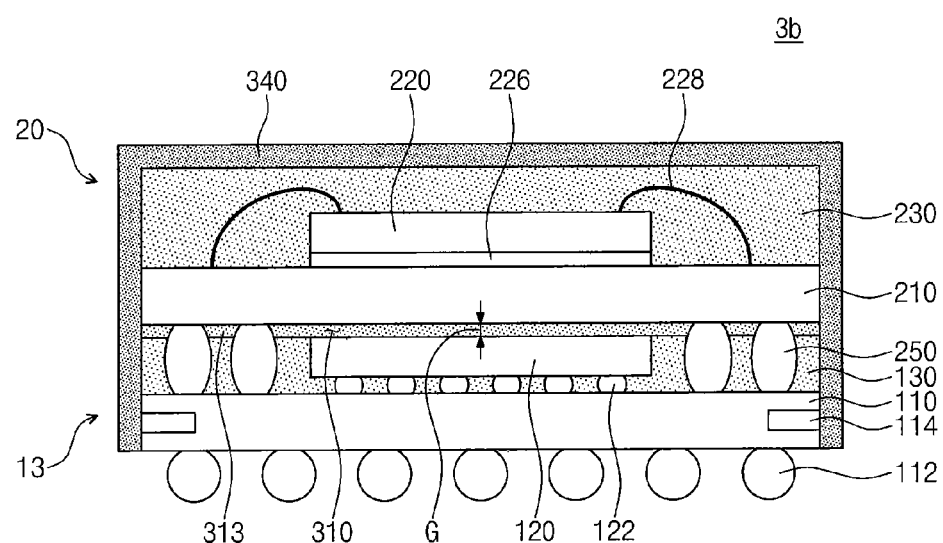

Referring to FIG. 15B, a semiconductor package 3b may be fabricated to include an insulating layer 313 completely filling the gap 310 between the lower and upper packages 13 and 20. In this case, there is no chance that the shielding layer 340 is formed in the gap 310, even when the size of the metal particles constituting the shielding layer 340 is smaller than the size G of the gap 310.

Figure 15C:
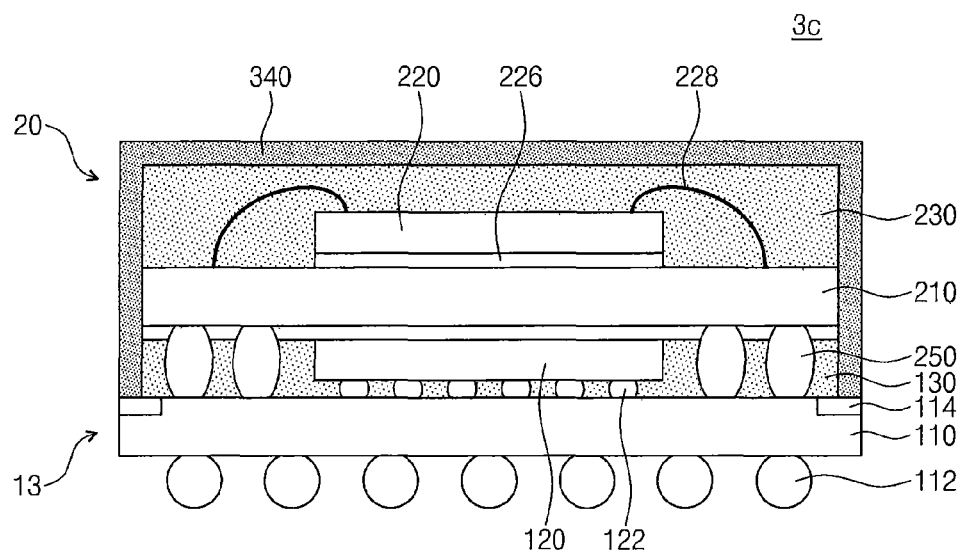

Referring to FIG. 15C, a semiconductor package 3c may be fabricated to include the package substrate 110 and the ground pad 114 provided on the edge region of the package substrate 110. The mold layer 130 of the lower package 13 may have a size smaller than that of the package substrate 110. For example, the mold layer 130 may be formed to expose the edge region of the top surface of the package substrate 110. The shielding layer 340 may be extended to the exposed edge region of the top surface of the package substrate 110 and may be coupled to the ground pad 114.

Figure 15D:
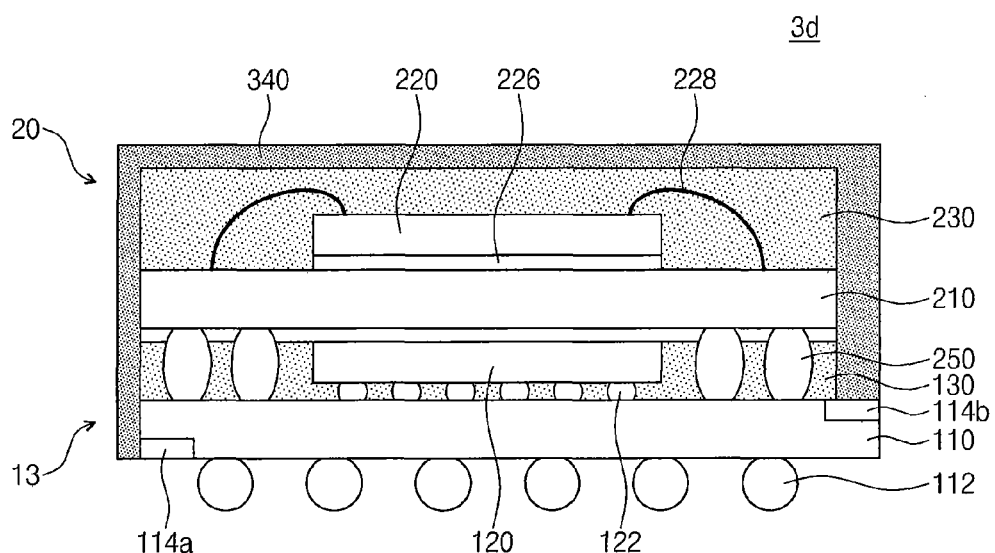

Referring to FIG. 15D, a semiconductor package 3d may be fabricated to include the package substrate 110, in which the first ground pad 114a is provided on a bottom surface of an edge region thereof and the second ground pad 114b is provided on a top surface of an opposite edge region thereof. The mold layer 130 of the lower package 13 may be provided to cover the top surface of the edge region of the package substrate 110 and expose the top surface of the opposite edge region of the package substrate 110. The shielding layer 340 may be provided to cover the side surface of the edge region of the package substrate 110 and may be coupled to the first ground pad 114a, and it may be provided to cover the top surface of the opposite edge region of the package substrate 110 and may be coupled to the second ground pad 114b.

When the package substrate 110 is rectangular in a plan view, the first ground pad 114a may be provided on a bottom surface of at least one of four edge regions of the package substrate 110 and the second ground pad 114b may be provided on a top surface of another edge region of the package substrate 110. As another example, the first ground pad 114a may be provided on a side surface of an edge region of the package substrate 110.

FIGS. 16A through 16F are sectional views illustrating methods of fabricating a semiconductor package according to some example embodiments of the inventive concept. FIG. 16G is an enlarged plan view illustrating a portion of FIG. 16F.

Figure 16A:
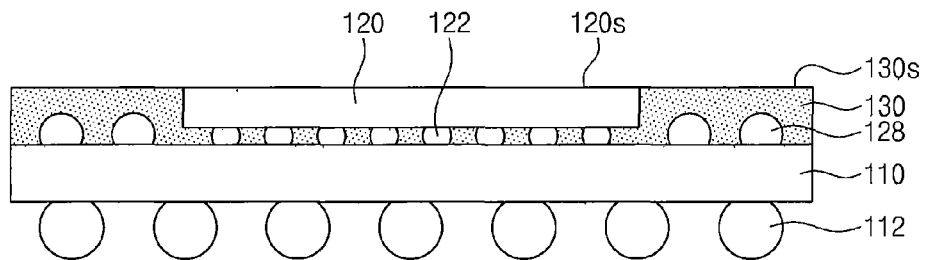
FIGS. 16A through 16F are sectional views illustrating methods of fabricating a semiconductor package according to some example embodiments of the inventive concept.

Referring to FIG. 16A, the semiconductor chip 120 may be mounted on the package substrate 110 (e.g., in a flip-chip bonding manner) and may be electrically connected to the package substrate 110 via the inner terminals 122, and the mold layer 130 may be formed to enclose the semiconductor chip 120. At least one lower connection terminal 128 (e.g., a solder ball) may be formed on the package substrate 110 and around the semiconductor chip 120. The mold layer 130 may be formed by, for example, a MUF process and may have the top surface 130s that is substantially coplanar with the top surface 120s of the semiconductor chip 120. The top surface 120s of the semiconductor chip 120 may serve as an inactive surface. At least one outer terminal 112 (e.g., a solder ball) may be attached to the bottom surface of the package substrate 110.

Figure 16B:
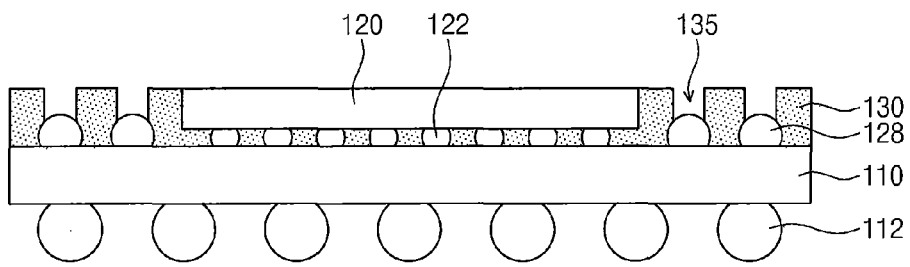

Referring to FIG. 16B, a portion of the mold layer 130 may be selectively removed to form the opening 135 exposing the lower connection terminal 128. The opening 135 may be formed by, for example, a mechanical drilling process, a laser drilling process, or an etching process. A cleaning process may be further performed, after the formation of the opening 135.

Figure 16C:
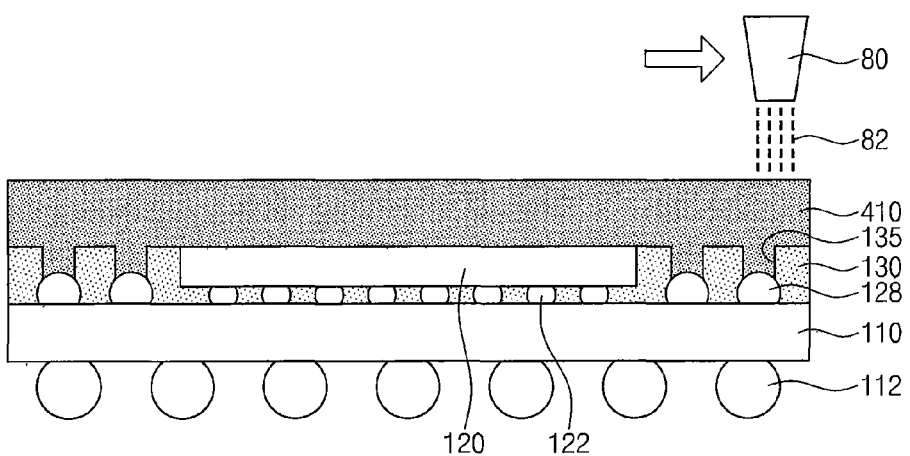

Referring to FIG. 16C, a metal layer 410 may be formed on the package substrate 110 to cover the semiconductor chip 120 and the mold layer 130 and fill the opening 135. The metal layer 410 may be formed using, for example, the cold spray process previously described with reference to FIG. 1C. For example, the formation of the metal layer 410 may include spraying the mixture 82 of metal powder and gas onto the package substrate 110, while moving the spray nozzle 80 in a horizontal direction. Since the metal layer 410 is formed by the cold spray process, it is possible to suppress or control warpage of the package substrate 110 mounted with the semiconductor chip 120, as described previously with reference to FIGS. 3A and 3B.

Figure 16D:
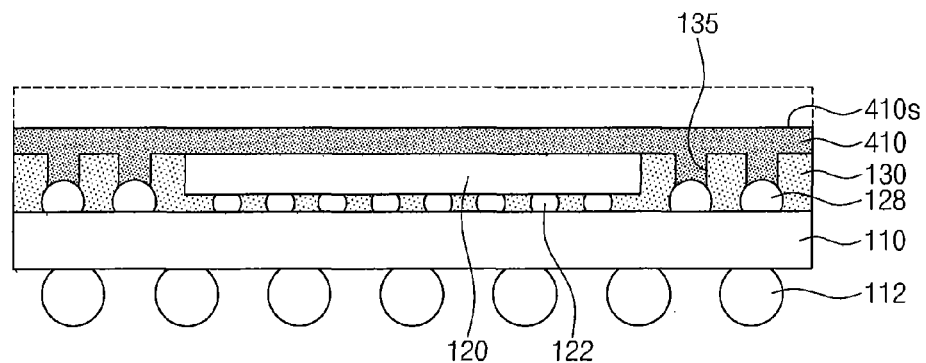

Referring to FIG. 16D, a grinding process may be performed on the metal layer 410 to reduce a thickness of the metal layer 410. As a result of the grinding process, a top surface 410s of the metal layer 410 may have a flat or even shape. In certain embodiments, the process of reducing the thickness of the metal layer 410 may be performed using a chemical-mechanical polishing process or an etch-back process. As another example, the grinding process on the metal layer 410 may be omitted. In this case, the top surface 140s of the metal layer 410 may have an uneven surface, as described with reference to FIG. 1E.

Figure 16E:
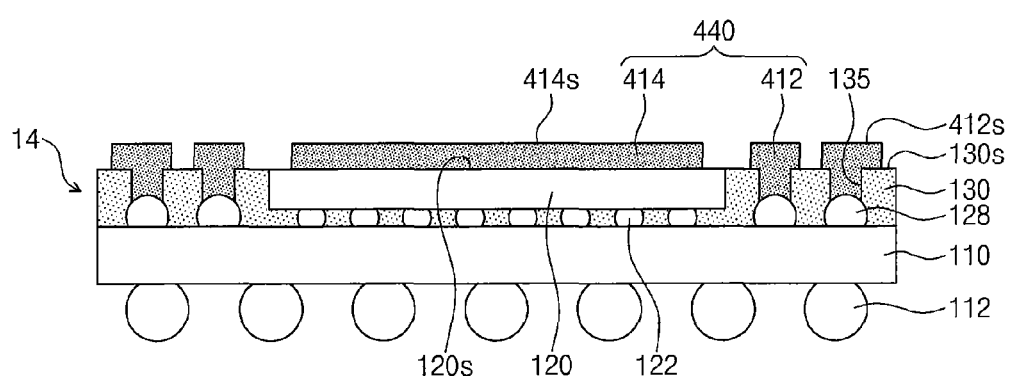

Referring to FIG. 16E, a lower package 14 may be fabricated by forming an interposer 440 on the resulting structure. The interposer 440 may include a first interposer layer 412 and a second interposer layer 414, which are formed by patterning the metal layer 410. For example, an etching process may be performed to selectively remove a portion of the metal layer 410, and as a result of the etching process, the first interposer layer 412 may be formed to fill the opening 135 and the second interposer layer 414 may be formed on the semiconductor chip 120 to be spaced apart from the first interposer layer 412. The first interposer layer 412 may be in direct contact with the lower connection terminal 128, and the second interposer layer 414 may be in direct contact with the top surface 120s of the semiconductor chip 120.

The second interposer layer 414 may be provided to partially or wholly cover the top surface 120s of the semiconductor chip 120. In addition, the second interposer layer 414 may be extended toward the mold layer 130 to cover a portion of the top surface 130s of the mold layer 130. The interposer 440 may include a plurality of first interposer layers 412, which are arranged around the second interposer layer 414, as shown in FIG. 16G.

In the case where the grinding process of FIG. 16D is performed, at least one of a top surface 412s of the first interposer layer 412 and a top surface 414s of the second interposer layer 414 may be an even surface. In the case where the grinding process of FIG. 16D is omitted, at least one of the top surface 412s of the first interposer layer 412 and the top surface 414s of the second interposer layer 414 may be an uneven surface. Regardless of the grinding process on the metal layer 410, the top surface 120s of the semiconductor chip 120 may be an uneven surface, as described with reference to FIG. 1E.

Figure 16F:
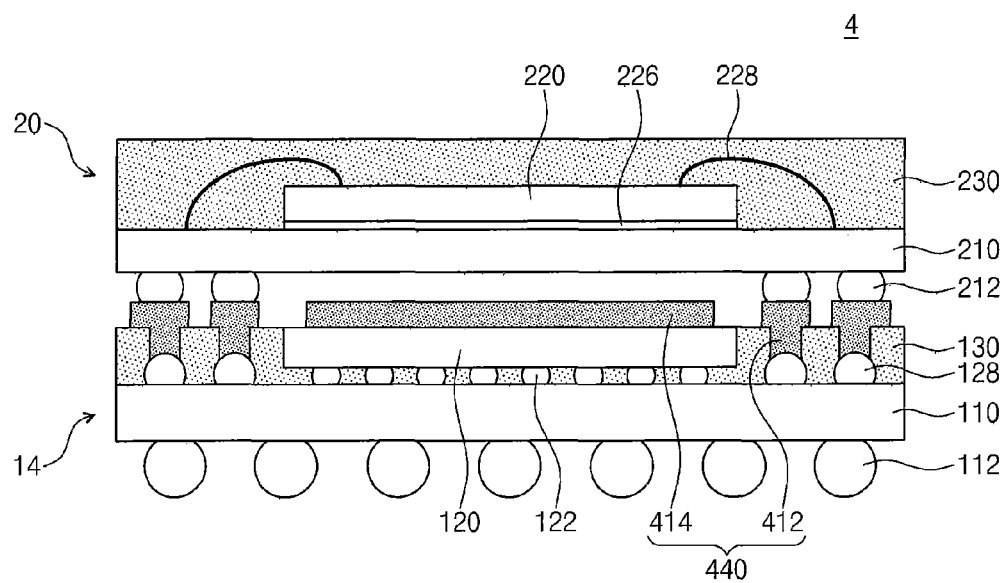
Figure 16G:
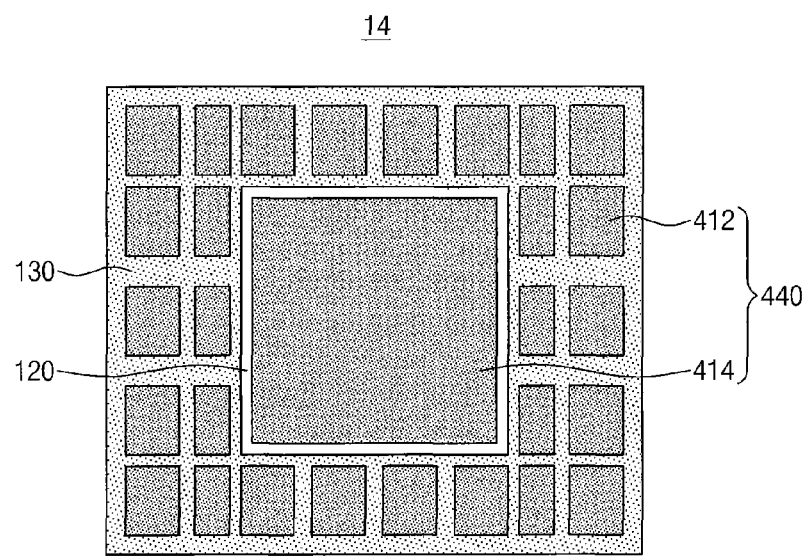
FIG. 16G is an enlarged plan view illustrating a portion of FIG. 16F.

Referring to FIG. 16F, a PoP-type semiconductor package 4 may be fabricated by providing the upper package 20 on the lower package 14. Since the upper connection terminal 212 of the upper package 20 is connected to the first interposer layer 412, the lower package 14 may be electrically connected to the upper package 20. The first interposer layer 412 may serve as a contact plug for interconnection, and the second interposer layer 414 may serve as a warpage-prevention layer and a heat dissipation layer. In some embodiments, the formation of the second interposer layer 414 may be omitted. The structure of the semiconductor package 4 may be variously modified, as will be described with reference to FIGS. 17A and 17B.

Figure 17A:
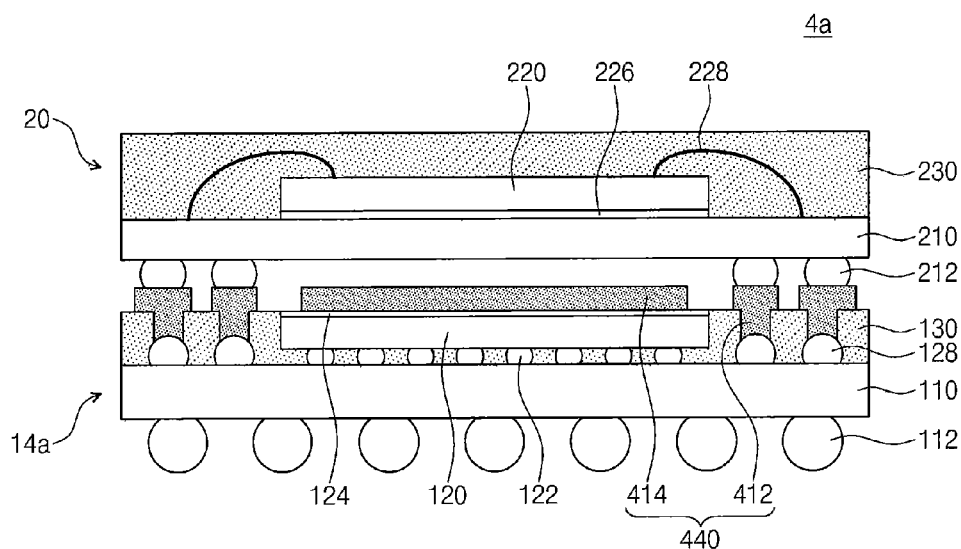
FIGS. 17A and 17B are sectional views illustrating modified examples of FIG. 16F.
Figure 17B:
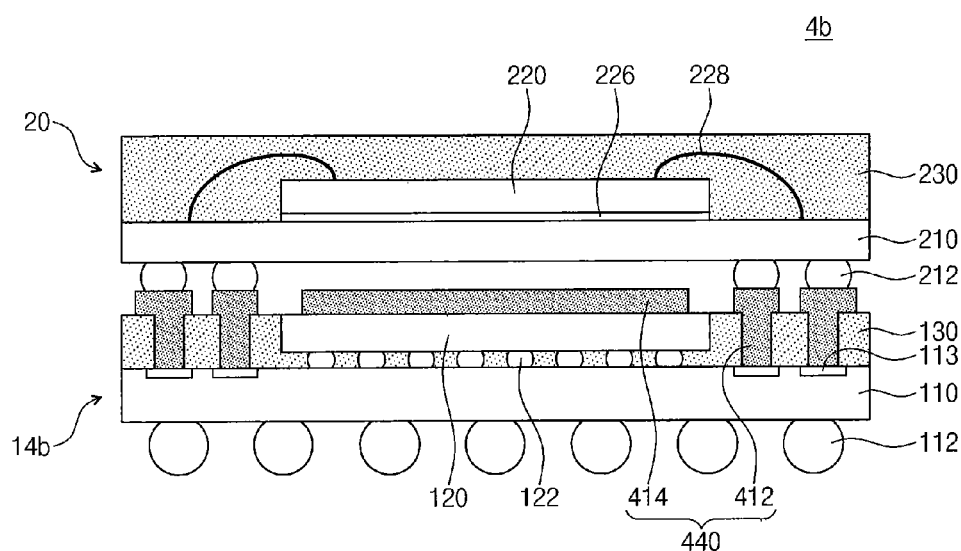

FIGS. 17A and 17B are sectional views illustrating modified examples of FIG. 16F.

Referring to FIG. 17A, a semiconductor package 4a may be fabricated by stacking the upper package 20 on the lower package 14a, in which the insulating layer 124 is provided between the semiconductor chip 120 and the second interposer layer 414. In some embodiments, due to the presence of the insulating layer 124, it is possible to prevent a short circuit from being formed between the semiconductor chip 120 and the second interposer layer 414.

Referring to FIG. 17B, a semiconductor package 4b may be fabricated by stacking the upper package 20 on the lower package 14b including a substrate pad 113, which is provided on the edge region of the top surface of the package substrate 110 and is electrically connected to the first interposer layer 412. In some embodiments, the first interposer layer 412 may be provided to completely pass through the mold layer 130 and may be coupled to the substrate pad 113.

FIGS. 18A through 18E are sectional views illustrating methods of fabricating a semiconductor package according to some example embodiments of the inventive concept.

Figure 18A:
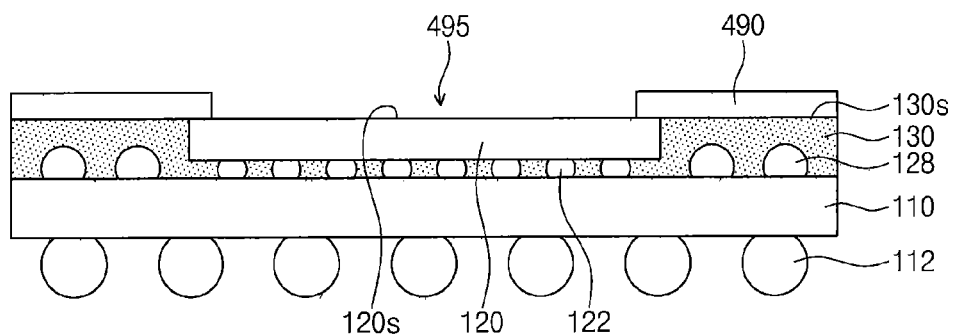
FIGS. 18A through 18E are sectional views illustrating methods of fabricating a semiconductor package according to some example embodiments of the inventive concept.

Referring to FIG. 18A, the semiconductor chip 120 may be bonded on the package substrate 110 (e.g., a flip-chip bonding manner) and the mold layer 130 may be formed on the resulting structure (for example, using the same or similar method as previously described with reference to FIGS. 16A and 16B). A passivation layer 490 may be formed to cover the top surface 130s of the mold layer 130 and have a hole 495 exposing at least a portion of the top surface 120s of the semiconductor chip 120. The top surface 120s of the semiconductor chip 120 may serve as an inactive surface. The passivation layer 490 may be formed by depositing an insulating material (e.g., silicon oxide, silicon nitride, or polymer).

Figure 18B:
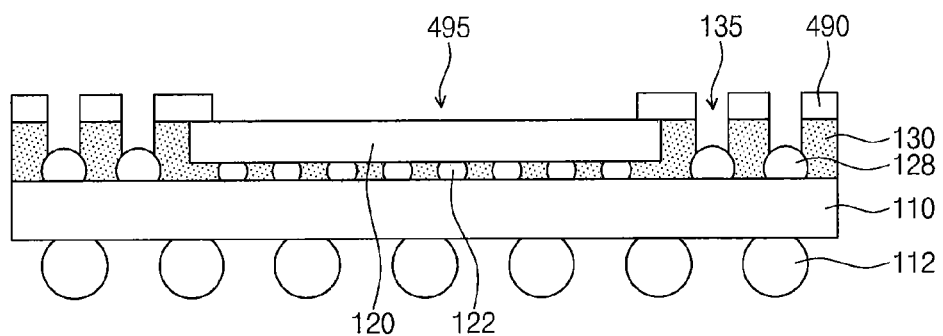

Referring to FIG. 18B, the opening 135 may be formed to expose the lower connection terminal 128. As an example, the passivation layer 490 and the mold layer 130 may be partially and selectively removed by a mechanical drilling process, a laser drilling process, or an etching process, and as a result, the opening 135 may be formed. A cleaning process may be further performed, after the formation of the opening 135.

Figure 18C:
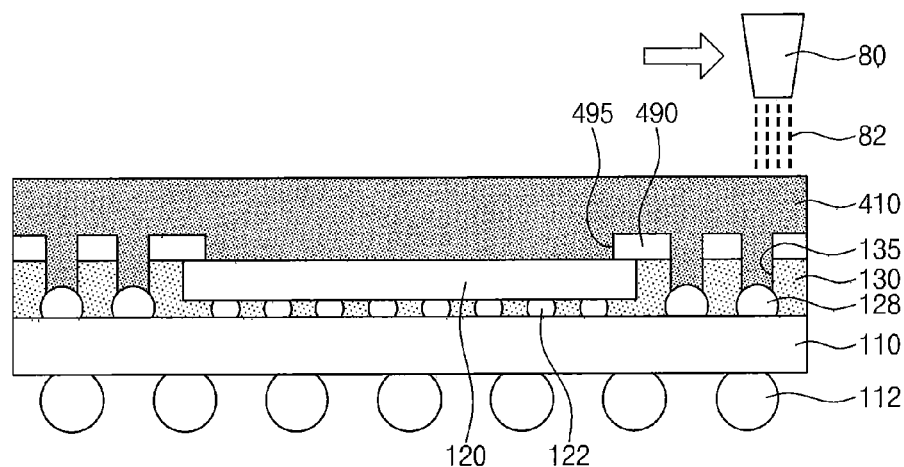

Referring to FIG. 18C, the metal layer 410 may be formed on the package substrate 110 by, for example, the cold spray process previously described with reference to FIG. 1C. The metal layer 410 may be formed to cover the passivation layer 490 and the semiconductor chip 120 and fill the hole 495 and the opening 135.

Figure 18D:
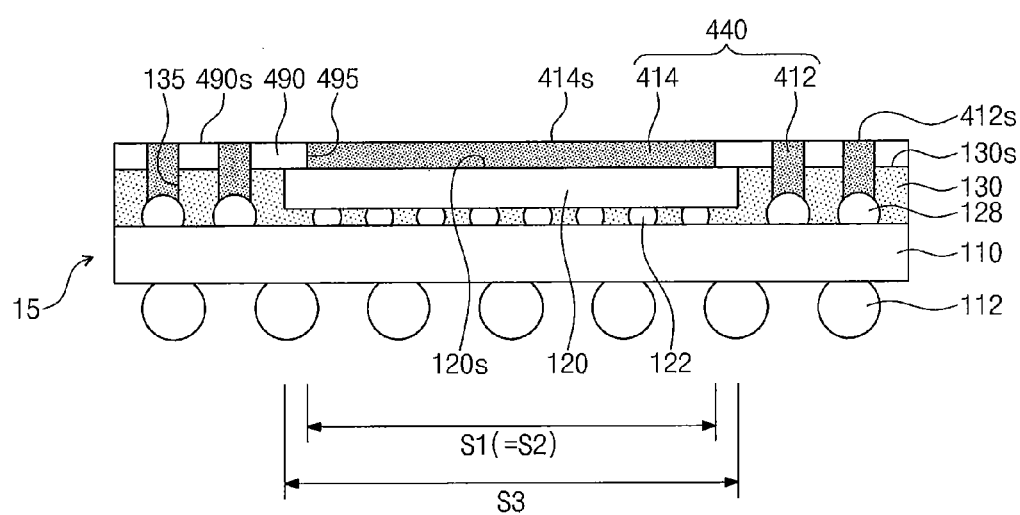

Referring to FIG. 18D, a grinding process may be performed on the metal layer 410 to expose the passivation layer 490. The interposer 440 may be formed, as a result of the grinding process on the metal layer 410. Furthermore, by performing the grinding process on the metal layer 410, it is possible to form a lower package 15 including the interposer 440, and here, the interposer 440 may include the first interposer layer 412, which is provided to fill the opening 135 and is coupled to the lower connection terminal 128, and the second interposer layer 414, which is provided to fill the hole 495 and be in direct contact with the semiconductor chip. As a result of the grinding process, the top surface 412s of the first interposer layer 412, the top surface 414s of the second interposer layer 414, and a top surface 490s of the passivation layer 490 may be formed to have a flat or even shape. By contrast, the top surface 120s of the semiconductor chip 120 may have a non-flat or uneven shape, as a result of the cold spray process.

A size S1 of the second interposer layer 414 may be substantially the same as a size S2 of the hole 495. As an example, the size S2 of the hole 495 may be smaller than a size S3 of the semiconductor chip 120, and the size S1 of the second interposer layer 414 may be smaller than the size S3 of the semiconductor chip 120. For example, the second interposer layer 414 may be formed to expose an edge region of the top surface 120s of the semiconductor chip 120.

As another example, the size S2 of the hole 495 may be substantially equal to the size S3 of the semiconductor chip 120, and the size S3 of the second interposer layer 414 may be substantially equal to the size S3 of the semiconductor chip 120. For example, the second interposer layer 414 may be formed to cover the entire region of the top surface 120s of the semiconductor chip 120.

As still another example, the size S2 of the hole 495 may be larger than the size S3 of the semiconductor chip 120, and the size S1 of the second interposer layer 414 may be larger than the size S3 of the semiconductor chip 120. In this case, the second interposer layer 414 may be formed to further cover a portion of the mold layer 130 adjacent to a side surface of the semiconductor chip 120.

Figure 18E:
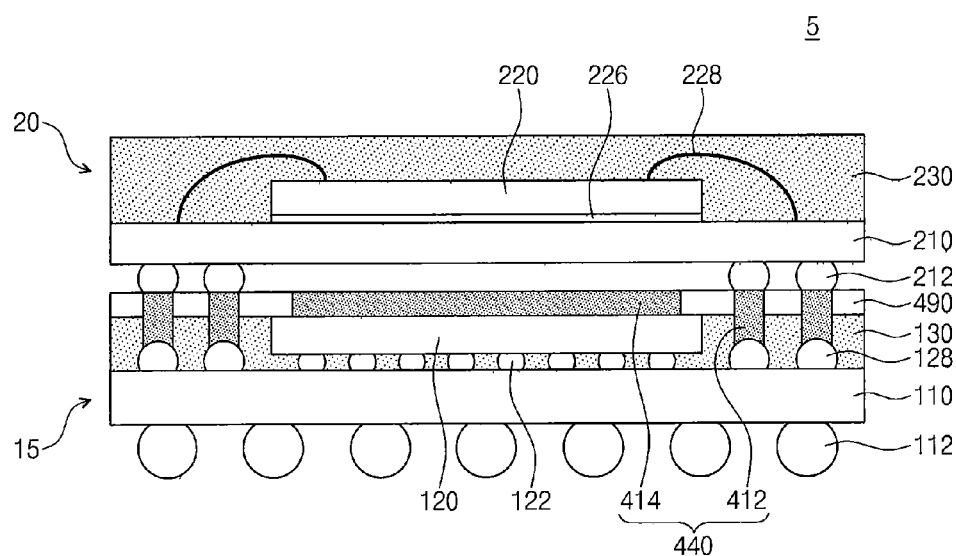

Referring to FIG. 18E, a PoP-type semiconductor package 5 may be fabricated by stacking the upper package 20 on the lower package 15, and here, the PoP-type semiconductor package 5 may include the interposer 440 including the first interposer layer 412 serving as a contact plug for interconnection and the second interposer layer 414 serving as a heat dissipation layer and a warpage-prevention layer. The first and second interposer layers 412 and 414 may be formed to have the same or similar planar arrangements as those shown in FIG. 16G.

As another example, the insulating layer 124 of FIG. 17A may be further provided between the semiconductor chip 120 and the second interposer layer 414. As still another example, instead of the lower connection terminal 128, the substrate pad 113 of FIG. 17B may be further provided on the edge region of the top surface of the package substrate 110. In this case, the first interposer layer 412 may be provided to completely pass through the passivation layer 490 and the mold layer 130 and may be coupled to the substrate pad 113.

FIGS. 19A through 19E are sectional views illustrating methods of fabricating a semiconductor package according to some example embodiments of the inventive concept.

Figure 19A:
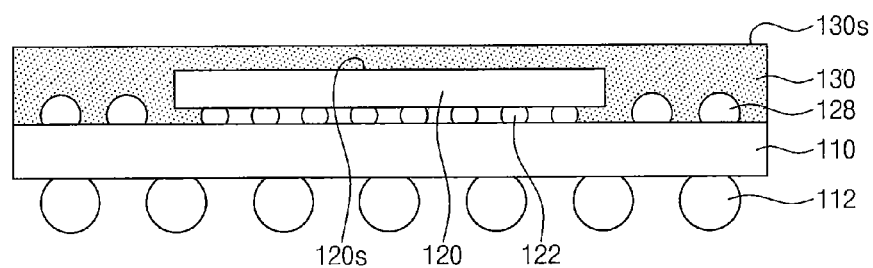
FIGS. 19A through 19E are sectional views illustrating methods of fabricating a semiconductor package according to some example embodiments of the inventive concept.

Referring to FIG. 19A, the semiconductor chip 120 may be bonded on the package substrate 110 (e.g., a flip-chip bonding manner) and the mold layer 130 may be formed on the resulting structure. The mold layer 130 may cover the semiconductor chip 120. Accordingly, the top surface 130s of the mold layer 130s may be positioned at a higher level than the top surface 120s of the semiconductor chip 120. The top surface 120s of the semiconductor chip 120 may serve as an inactive surface.

Figure 19B:
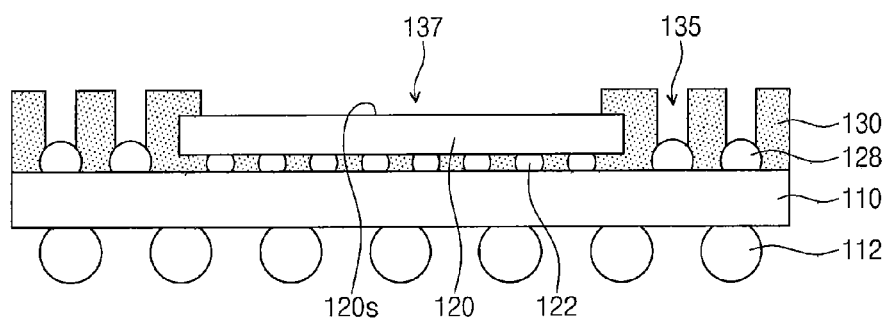

Referring to FIG. 19B, the opening 135 may be formed to expose the lower connection terminal 128 and a hole 137 may be formed to expose the semiconductor chip 120. As an example, the formation of the opening 135 and the hole 137 may include a drilling or etching process performed to selectively remove the mold layer 130. The top surface 120s of the semiconductor chip 120 may be exposed through the hole 137. A cleaning process may be further performed, after the formation of the opening 135 and the hole 137.

Figure 19C:
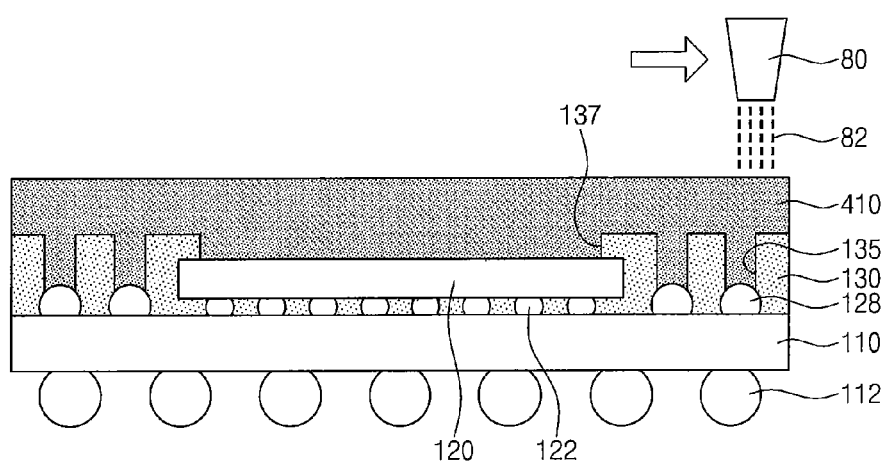

Referring to FIG. 19C, the metal layer 410 may be formed on the package substrate 110 by, for example, the cold spray process previously described with reference to FIG. 1C. The metal layer 410 may be formed to cover the semiconductor chip 120 and fill the hole 137 and the opening 135.

Figure 19D:
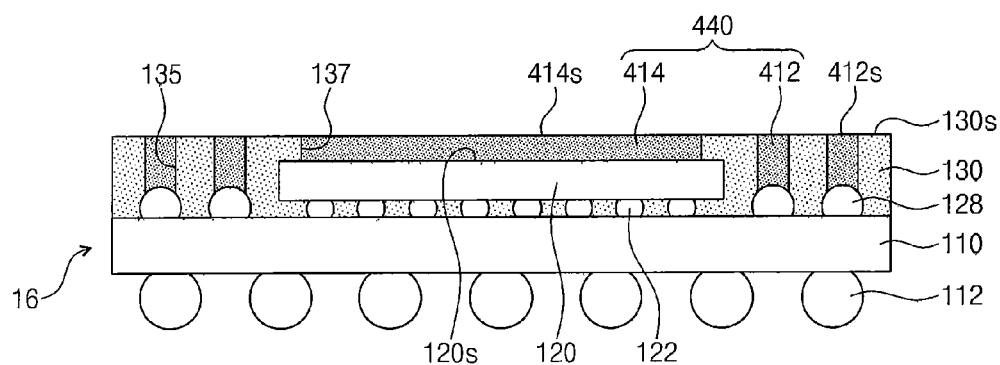

Referring to FIG. 19D, a grinding process may be performed on the metal layer 410 to expose the top surface 130s of the mold layer 130. The interposer 440 may be formed, as a result of the grinding process on the metal layer 410. Furthermore, by performing the grinding process on the metal layer 410, it is possible to form a lower package 16 including the interposer 440, and here, the interposer 440 may include the first interposer layer 412, which is provided to fill the opening 135 and is coupled to the lower connection terminal 128, and the second interposer layer 414, which is provided to fill the hole 137 and be in direct contact with the semiconductor chip 120.

As a result of the grinding process, the top surface 412s of the first interposer layer 412, the top surface 414s of the second interposer layer 414, and the top surface 130s of the mold layer 130 may be formed to have a flat or even shape. By contrast, the top surface 120s of the semiconductor chip 120 may have a non-flat or uneven shape, as a result of the cold spray process. As described with reference to FIG. 18D, a size of the second interposer layer 414 may be determined depending on a size of the hole 137.

Figure 19E:
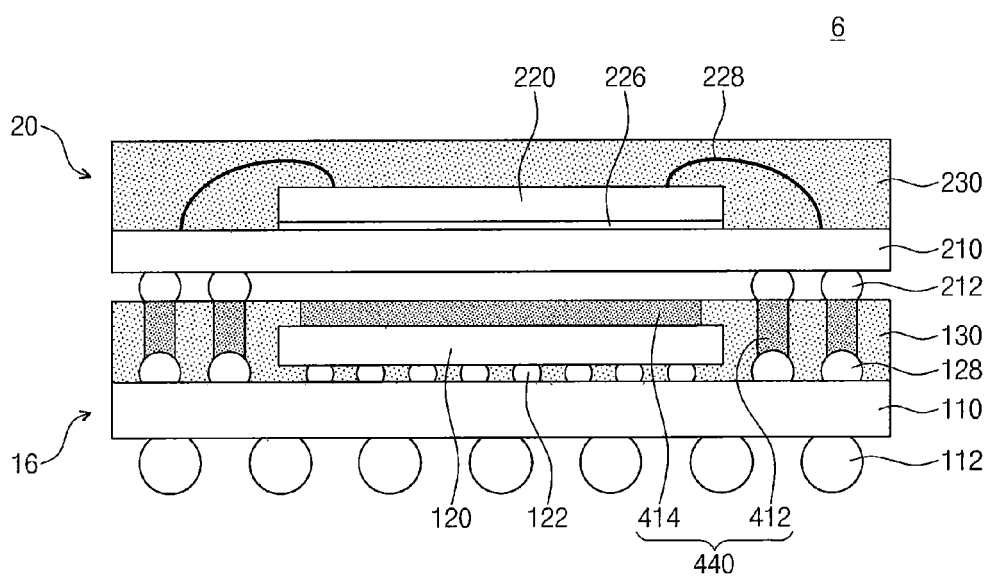

Referring to FIG. 19E, a PoP-type semiconductor package 6 may be fabricated by stacking the upper package 20 on the lower package 16, and here, the PoP-type semiconductor package 6 may include the interposer 440 including the first interposer layer 412 serving as a contact plug for interconnection and the second interposer layer 414 serving as a heat dissipation layer and a warpage-prevention layer. The first and second interposer layers 412 and 414 may be formed to have the same or similar planar arrangements as those shown in FIG. 16G.

Similar to that of FIG. 17A, the insulating layer 124 may be further provided between the semiconductor chip 120 and the second interposer layer 414. Alternatively, similar to that of FIG. 17B, the lower connection terminal 128 may not be provide, the substrate pad 113 may be further provided on the edge region of the top surface of the package substrate 110, and the first interposer layer 412 may be provided to completely pas through the mold layer 130 and may be coupled to the substrate pad 113.

According to some example embodiments of the inventive concept, a cold spray process may be performed to form a heat dissipation layer in direct contact with a semiconductor chip, and this makes it possible to reduce loss in heat transfer from a semiconductor chip to the heat dissipation layer. In addition, when the heat dissipation layer is cooled, the heat dissipation layer may exert a compressive force to a semiconductor package, and the compressive force may be used to suppress or prevent the semiconductor package from suffering from a warpage issue. That is, according to some example embodiments of the inventive concept, it is possible to improve thermal characteristics of a semiconductor package, to prevent failures of the semiconductor package caused by the warpage, and thereby to increase production yield of the semiconductor package.

Furthermore, the cold spray process may be performed in such a way that an EMI shielding layer is not formed in a gap between upper and lower packages of a PoP-type semiconductor package. Accordingly, it is possible to prevent the EMI shielding layer from being in contact with connection terminals of the upper and lower packages. That is, it is possible to prevent a short circuit through the EMI shielding layer and thereby to improve electric characteristics of the semiconductor package. Also, a cold spray process may be performed to form an interposer on the lower package, and the interposer may make it possible to form electric connection paths between the upper and lower packages and moreover to improve heat dissipation and warpage characteristics of the lower package.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
    a package substrate comprising a top surface and a bottom surface facing each other and a ground pad on the top surface of the package substrate;
    a semiconductor chip mounted on the top surface of the package substrate, the semiconductor chip comprising a bottom surface facing the top surface of the package substrate and a top surface that is opposite the bottom surface thereof;
    a mold layer lying on the top surface of the package substrate to enclose the semiconductor chip and having a top surface that is coplanar with the top surface of the semiconductor chip; and
    a heat dissipation layer provided on the semiconductor chip and the mold layer,
    wherein the heat dissipation layer is in direct contact with the top surface of the semiconductor chip and the top surface of the mold layer and comprises a ground contact that passes through the mold layer and is electrically connected to the ground pad, and
    the top surface of the semiconductor chip has a surface roughness that is smaller than a surface roughness of the top surface of the mold layer.

2. The semiconductor package of claim 1, wherein the heat dissipation layer comprises:
    a bottom surface that is in direct contact with the top surface of the semiconductor chip and the top surface of the mold layer; and
    a top surface that is opposite the bottom surface thereof, wherein the top surface of the heat dissipation layer is uneven.

3. The semiconductor package of claim 1, wherein the heat dissipation layer has a uniform thickness on the top surface of the package substrate.

4. The semiconductor package of claim 1, wherein the heat dissipation layer has a non-uniform thickness on the top surface of the package substrate.

5. The semiconductor package of claim 1, wherein the heat dissipation layer completely covers the top surfaces of the semiconductor chip and the mold layer.

6. The semiconductor package of claim 1, wherein the heat dissipation layer covers a portion of the top surface of the semiconductor chip and a portion of the top surface of the mold layer.

* * * * *